(12) United States Patent
Sugimoto et al.

(10) Patent No.: US 8,484,414 B2
(45) Date of Patent: Jul. 9, 2013

(54) STORAGE SYSTEM HAVING PLURALITY OF FLASH PACKAGES

(75) Inventors: Sadahiro Sugimoto, Kawasaki (JP); Akira Yamamoto, Sagamihara (JP); Masayuki Yamamoto, Sagamihara (JP); Akihiko Araki, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 96 days.

(21) Appl. No.: 12/664,721

(22) PCT Filed: Aug. 31, 2009

(86) PCT No.: PCT/JP2009/004259
§ 371 (c)(1),
(2), (4) Date: Dec. 15, 2009

(87) PCT Pub. No.: WO2011/024239
PCT Pub. Date: Mar. 3, 2011

(65) Prior Publication Data
US 2011/0231594 A1    Sep. 22, 2011

(51) Int. Cl.
G06F 13/00    (2006.01)
(52) U.S. Cl.
USPC ..... 711/114; 711/103; 711/206; 711/E12.014
(58) Field of Classification Search
None
See application file for complete search history.

(56) References Cited

U.S. PATENT DOCUMENTS

| | | | |
|---|---|---|---|
| 5,479,638 A * | 12/1995 | Assar et al. | 711/103 |
| 5,644,539 A | 7/1997 | Yamagami et al. | |
| 2005/0114728 A1 | 5/2005 | Aizawa et al. | |
| 2007/0250679 A1 | 10/2007 | Umemura et al. | |
| 2008/0022163 A1 | 1/2008 | Tanaka et al. | |
| 2008/0168304 A1 * | 7/2008 | Flynn et al. | 714/7 |
| 2008/0201544 A1 | 8/2008 | Nakajima et al. | |
| 2008/0256292 A1 * | 10/2008 | Flynn et al. | 711/114 |
| 2008/0313364 A1 * | 12/2008 | Flynn et al. | 710/31 |
| 2009/0150605 A1 * | 6/2009 | Flynn et al. | 711/112 |
| 2010/0017649 A1 * | 1/2010 | Wu et al. | 714/6 |
| 2012/0284476 A1 | 11/2012 | Seki et al. | |

FOREIGN PATENT DOCUMENTS

| | | |
|---|---|---|
| JP | 5-204561 A | 8/1993 |
| JP | 2005-157739 A | 6/2005 |
| JP | 2007-293442 A | 11/2007 |
| JP | 2008-009635 A | 1/2008 |
| JP | 2008-146574 A | 6/2008 |
| JP | 2008-198049 A | 8/2008 |

OTHER PUBLICATIONS

Japanese Office Action received in Japanese Application No. 2011-544717 issued Mar. 5, 2013.

* cited by examiner

*Primary Examiner* — Edward Dudek, Jr.
*Assistant Examiner* — Sean D Rossiter
(74) *Attorney, Agent, or Firm* — Mattingly & Malur, PC

(57) ABSTRACT

The storage system comprises a plurality of flash packages configuring one or more RAID groups, and a controller coupled to the plurality of flash packages. Each flash package comprises a plurality of flash chips configured from a plurality of physical blocks. The controller identifies a target area related to an unnecessary area, unmaps a physical block allocated to a logical block belonging to this target area from this logical block, and manages the unmapped physical block as a free block.

3 Claims, 21 Drawing Sheets

STORAGE SYSTEM HAVING PLURALITY OF FLASH PACKAGES

TECHNICAL FIELD

The present invention relates to a storage system.

BACKGROUND ART

A storage system that uses flash memory as a storage medium instead of a hard disk is conceivable. A flash memory (for example, a NAND flash memory) is configured from a plurality of flash memory chips (called flash chips below). Each flash chip is configured from a plurality of physical blocks.

The flash memory is advantageous in that it is capable of operating at higher speeds and consumes less power than the hard disk. However, by contrast, it also has the following limitations.

First is the fact that the updating of each bit of memory is limited to one direction, i.e., from 1 to 0 (or from 0 to 1). In a case where a reverse update is required, an erase process, in which all the cell bits configuring the physical block are set to 1 (or 0), must be carried out for a physical block.

Second, the erase count per physical block is limited. For example, in the case of a NAND flash memory, the limit of the erase count per physical block is between around 10,000 and 100,000.

For the above reasons, in a case where a flash memory is used instead of a hard disk as the storage medium in a storage system, there is the concern that the bias of the rewrite frequency for each physical block will result in only some of the physical blocks reaching the erase count limit and becoming unusable. For example, in an ordinary file system, since the rewrite frequency to a logical block allocated to either a directory or an i-node is higher than the rewrite frequency to another logical block, it is highly likely that the erase count for the physical block allocated to the logical block that has been allocated to either the directory or the i-node will reach the limit.

With regard to this problem, as shown in Patent Literature 1, technology for extending the service life of a storage apparatus by allocating a physical block (an alternate block) that will serve as an alternate for the physical block (the bad block) that has become unusable is known.

Further, as shown in Patent Literature 2, technology (wear-leveling) for leveling the erase counts of the physical blocks by dynamically changing the logical/physical mapping (for example, the corresponding relationship between a logical block and a physical block) is also known. Wear-leveling algorithms include dynamic wear-leveling and static wear-leveling. Dynamic wear-leveling is the migrating of data as much as possible to a free block with a low erase count when erasing a physical block in line with a data update. In static wear-leveling, data that is not to be updated (static data) may also become the target of a migration.

CITATION LIST

Patent Literature

[PTL 1]
Japanese Laid-open Patent Publication No. H5-204561
[PTL 2]
U.S. Pat. No. 5,479,638

SUMMARY OF INVENTION

Technical Problem

A bias in the erase count can generate a large number of unusable physical blocks (physical blocks whose service life has ended). When this happens, the physical blocks (free blocks) capable of being allocated to the logical blocks are exhausted, thereby making it impossible to store new data on the storage system.

Therefore, an object of the present invention is for wear-leveling to be carried out efficiently inside a storage system.

Solution to Problem

A storage system comprises a plurality of flash packages, which configure one or more RAID (Redundant Array of Independent (or Inexpensive) Disks) groups, and a controller, which is coupled to the plurality of flash packages. Each flash package comprises a plurality of flash chips configured from a plurality of physical blocks. The controller identifies a target area related to an unused area, unmaps a physical block that has been allocated to a logical block belonging to this target area from this logical block, and manages the unmapped physical block as a free block.

DESCRIPTION OF EMBODIMENTS

Figure 1:
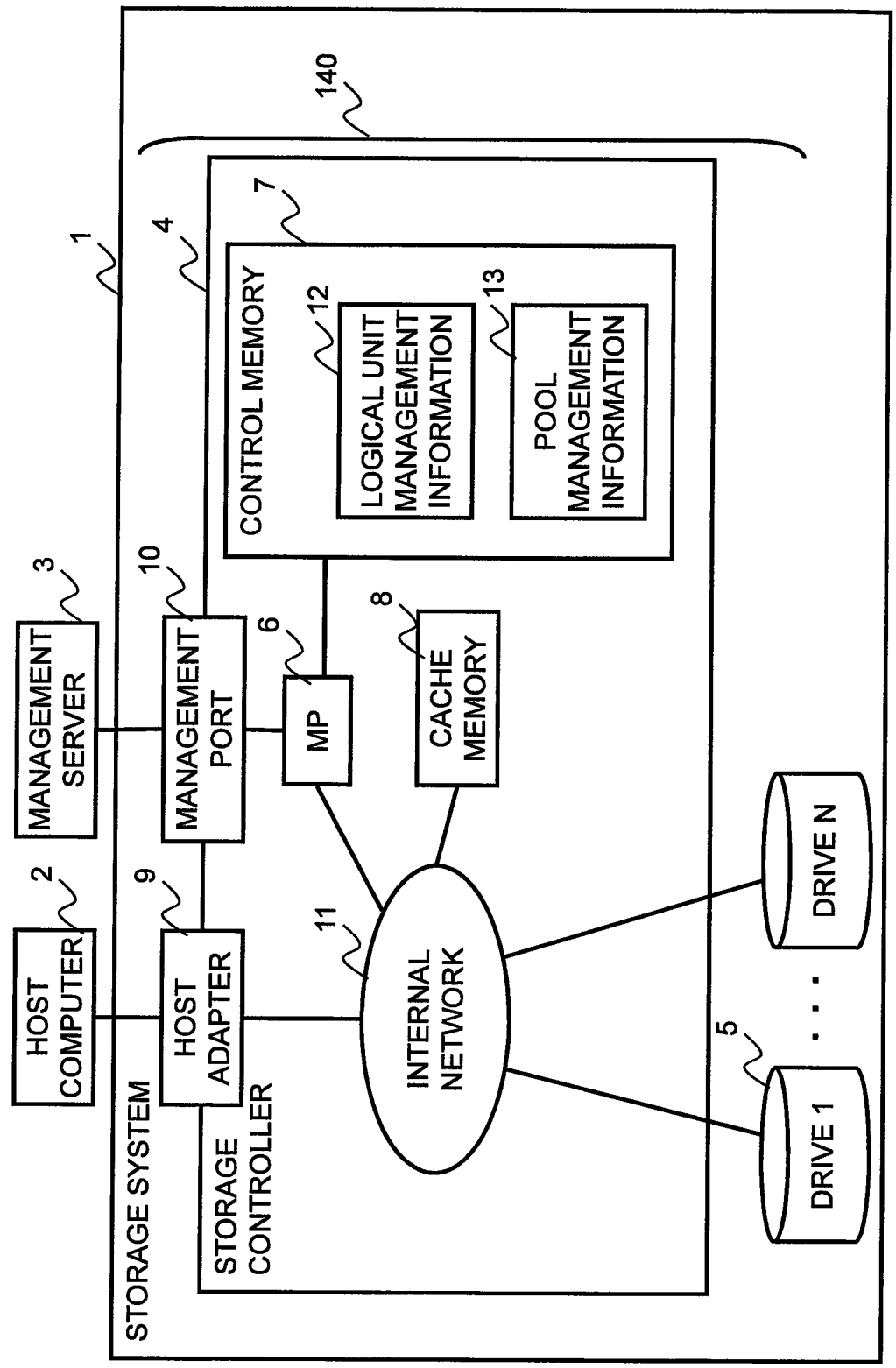
FIG. 1 is a diagram showing an example of the configuration of a computer system related to an embodiment of the present invention.

One embodiment of the present invention will be explained below.

First of all, the terminology used in this explanation will be explained.

Generally speaking, the smallest unit for reading and writing data in a so-called block storage is called a "block", but in a flash memory, the flash memory erase unit is called a "block". In order to distinguish between these in the explanation of this embodiment, the flash memory erase unit will be called a "block", and the smallest data read/write unit will be called a "sector". In this embodiment, one block includes a plurality of sectors. Specifically, for example, the flash memory is a NAND flash memory. For this reason, for example, the flash memory is configured from a plurality of flash chips, the flash chip is configured from a plurality of physical blocks, and the physical block is configured from a plurality of physical pages. In the NAND flash memory, the read/write unit is a "page", and the erase unit is the "block". However, the present invention is not limited to a storage system including this kind of flash memory, and is also applicable to a storage system including a flash memory having a different configuration.

Next, the term "chunk" will be explained. In managing a storage area, the storage controller (will be explained further below) is able to more flexibly control the allocation, unmapping and migration of the storage area by carrying out management in units that are smaller than the so-called logical unit. This storage area management unit will be called a "chunk" in the explanation of this embodiment. In the following embodiment, one logical unit includes a plurality of logical chunks, and in a case in which there is a write to any of the logical chunks, a physical chunk is allocated to this logical chunk. However, the present invention is not limited to a storage system including this kind of capacity virtualization function, and is also applicable to a storage system in which the storage area is managed in volume units. For example, one logical unit may be regarded as being configured from one chunk.

An overview of this embodiment will be explained next.

The storage system includes a storage controller, and a plurality of drives that use a flash memory as the storage medium. Each drive includes a drive controller.

The storage controller manages the corresponding relationship between a logical address of a logical unit and a logical address of each drive. The drive controller manages the corresponding relationship between the drive logical address and a physical address.

The storage controller identifies a target area related to an unused area, and sends an unmap instruction specifying the address of the identified target area to the drive. As used here, an unused area, for example, may be at least one of (1) through (5) below:

(1) an area inside the host file system in which a host has stored an erased file;
(2) an erased logical unit;
(3) a physical chunk, which has been unmapped from any logical chunk inside a logical unit;
(4) a migration-source area which contained data that was migrated from a certain drive to another drive; and
(5) an area in which data of a specific pattern (for example, "0" data) is repeatedly written.

The target area may be the same as the above-described unused area, or it may be larger or smaller than this unused area. The target area, for example, is determined on the basis of the RAID type of the RAID group based on the unused area.

The drive controller, in response to this unmap instruction, manages the physical block portion corresponding to the logical block portion including the specified address as being able to be unmapped. In a case where the drive controller manages an entire physical block as being able to be unmapped, this physical block is unmapped from the logical block. That is, the drive controller unmaps the allocation of this physical block to the logical block. The drive controller carries out an erase process with respect to the unmapped physical block. The drive controller determines whether or not the erase count of this physical block up until this point exceeds a predetermined threshold. In a case where the result of this determination is negative, the drive controller manages this physical block as an allocatable physical block (a free block). Consequently, since it is possible to increase the free blocks, an improvement in wear-leveling efficiency may be expected. Furthermore, in a case where the above determination result is affirmative, the drive controller manages this physical block as an unallocatable physical block (a bad block).

Further, in a case where a write to a certain drive has failed, and, in addition, the cause of this failure is the fact that there is a shortage of free blocks inside this drive, the storage controller migrates the data from this certain drive to another drive. Then, the storage controller sends an unmap instruction specifying the address of the storage area in which the migrated data had been stored to the original drive.

Also, in a case where a failure has occurred in a flash chip inside a certain drive, the storage controller restores the data inside this bad chip based on the data inside the other drive, and writes the restored data to another flash chip inside the above-mentioned certain drive. In accordance with this, it is possible to efficiently utilize the storage area of one drive.

Further, in a case where there is little remaining storage area, the storage controller issues a warning to an administrator. Specifically, for example, the storage controller outputs information denoting a warning to the computer being used by the administrator when the unallocated physical chunks have diminished.

This embodiment will be explained in detail below by referring to the drawings. Furthermore, in the following explanation, a command received by the storage controller from an external device (for example, a host computer) will be called a "request", and a command received by the drive from the storage controller will be called an "instruction".

FIG. 1 is a diagram showing an example of the configuration of a computer system related to the embodiment of the present invention.

A host computer 2, which is one type of external device, and which issues I/O (Input/Output) requests, and a management server 3, which is a computer for managing the storage system 1, are coupled to a storage system 1.

The storage system 1 includes a storage controller 4 and a plurality of drives 5. The drive 5 (each of the drives 5) may be a SSD (Solid State Drive).

A plurality of RAID (Redundant Array of Independent (or Inexpensive) Disks) groups are configured based on the plurality of drives 5. A RAID group is configured by two or more drives 5. The storage controller 4 stores data in a RAID group in accordance with a RAID type, which has been defined in advance for this RAID group.

A controller 140, for example, is configured in accordance with the storage controller 4 and a drive controller 220 (refer to FIG. 4) inside each drive 5.

The storage controller 4 includes one or more microprocessors (notated as MP below) 6 for controlling the storage system 1, a control memory 7 for holding data and a program for carrying out control, a cache memory 8, which is a memory for caching data, one or more host adapters 9 for exchanging data with the host computer 2, one or more management ports 10 for communication with the management server 3, and an internal network 11 for interconnecting the drive 5, cache memory 8, host adapter 9, and MP 6. The control memory 7 and the cache memory 8 may be the same memory. The data written to the drive 5 from the host computer 2, and the data read from the drive 5 to the host computer 2 are temporarily stored in the cache memory 8. In other words, the data that is written/read to/from the host computer 2 is input/output to/from the drive 5 by way of the cache memory 8.

The control memory 7 stores logical unit management information 12 including information related to each logical unit, and pool management information 13 including information related to a storage pool.

The storage controller 4 manages a logical unit configured from a plurality of logical chunks, and a pool. The pool includes a plurality of physical chunks. The plurality of physical chunks is a plurality of logical storage areas based on a plurality of RAID groups. Specifically, for example, a pool is configured from a plurality of physical chunks, and each logical unit is configured from a plurality of physical chunks included in a pool. Each physical chunk is based on two or more drives 5 that configure any of the RAID groups. Two or more logical blocks, of the plurality of logical blocks of a RAID group that constitutes the basis of the physical chunk, are allocated to this physical chunk. In a case where the storage controller 4 receives a write request from the host computer 2 and a physical chunk has not been assigned to the logical chunk (write-destination logical chunk) identified from the address specified in this write request, the storage controller 4 allocates an unallocated physical chunk inside the pool to the write-destination logical chunk.

Figure 2:
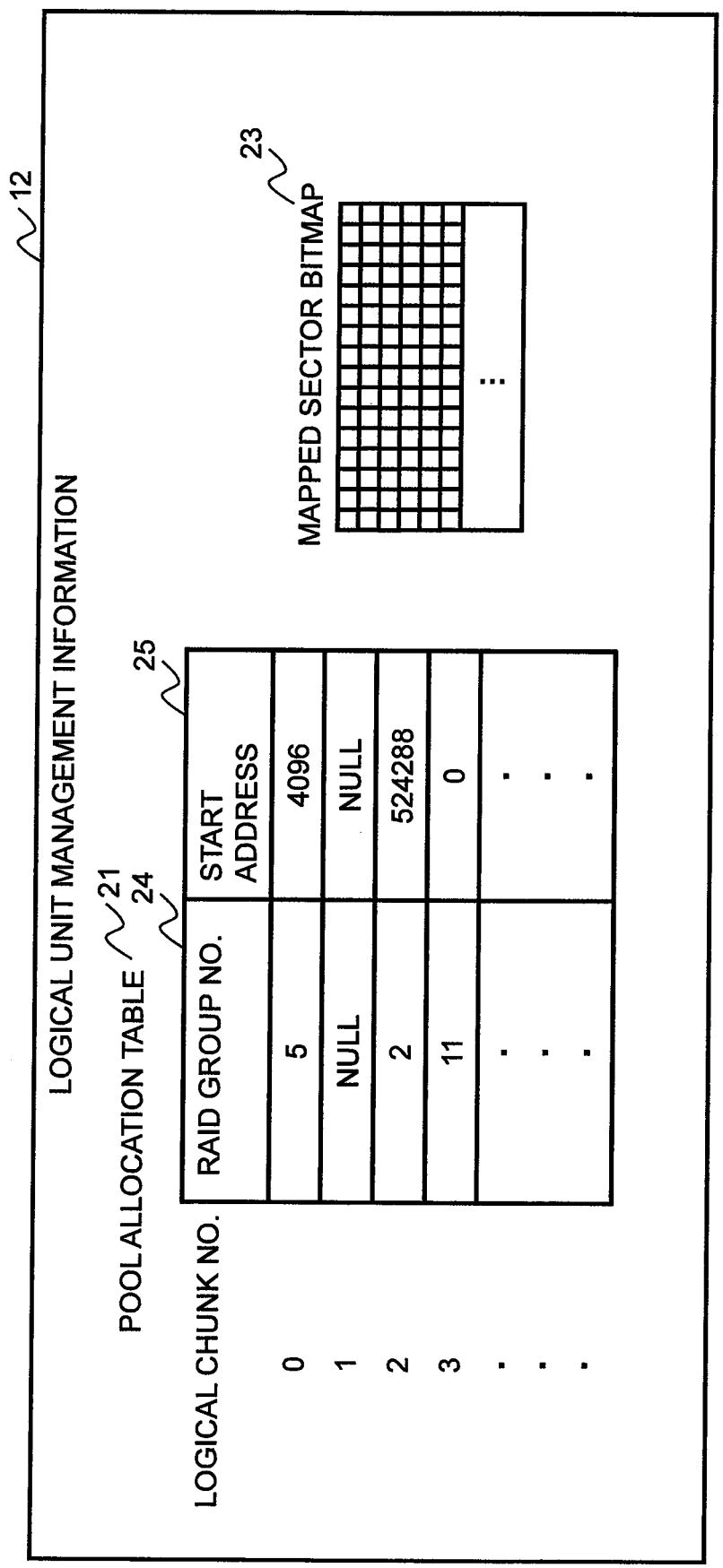
FIG. 2 is a diagram showing an example of logical unit management information 12.

FIG. 2 is a diagram showing an example of logical unit management information 12.

The logical unit management information 12 exists for each logical unit. The logical unit management information 12 includes a pool allocation table 21 and a mapped sector bitmap 23.

The pool allocation table 21 is for managing the allocation of a physical chunk to a logical unit corresponding to the logical unit management information 12 (called the "target logical unit" in the below explanation of FIG. 2). Specifically, the table 21 denotes the corresponding relationship between the logical chunks configuring the target logical unit and the physical chunk allocated to the logical chunks. The information denoting the physical chunk, for example, is configured from a RAID group number 24 and a start address 25. The RAID group number 24 and start address 25 corresponding to a logical chunk to which a physical chunk has not been allocated are invalid values (for example, NULL). The information 24 and 25 will be explained by giving a single physical chunk (called the "target physical chunk" below in this paragraph) as an example. The RAID group number 24 is the number of the RAID group that forms the basis of the target physical chunk. The start address 25 is the start address of the target physical chunk in the storage space of this RAID group. The storage controller 4 is able to calculate the address (the address in the logical block group) specified in the drive 5 by carrying out a predetermined computation based on (A) and (B) below:

(A) the address specified in the access request from the host computer 2; and (B) the RAID group number 24 and start address 25 of the physical chunk allocated to the logical chunk having the address of (A).

The mapped sector bitmap 23 is a bitmap denoting whether or not it is necessary to allocate a drive 5 storage area to each logical sector inside the target logical unit. Each logical chunk may comprise a plurality of sectors, and each sector may comprise a plurality of logical chunks. In other words, the logical chunk may be larger than the sector, or the sector may be larger than the logical chunk. For example, in a case where a write request specifying the address of sector 0 has been received from a higher-level device (the host computer 2), the storage controller 4 updates the bit 0 (a bit inside the mapped sector bitmap 23) corresponding to this sector 0 to ON (1). By contrast, in a case where an unmap request specifying the sector 0 address has been received from the host computer 2, the storage controller 4 updates the above-mentioned bit 0 to OFF (0). A bit that is ON (1) will be referred to as the "ON bit" and a bit that is OFF (0) will be referred to as the "OFF bit" below.

Figure 3:
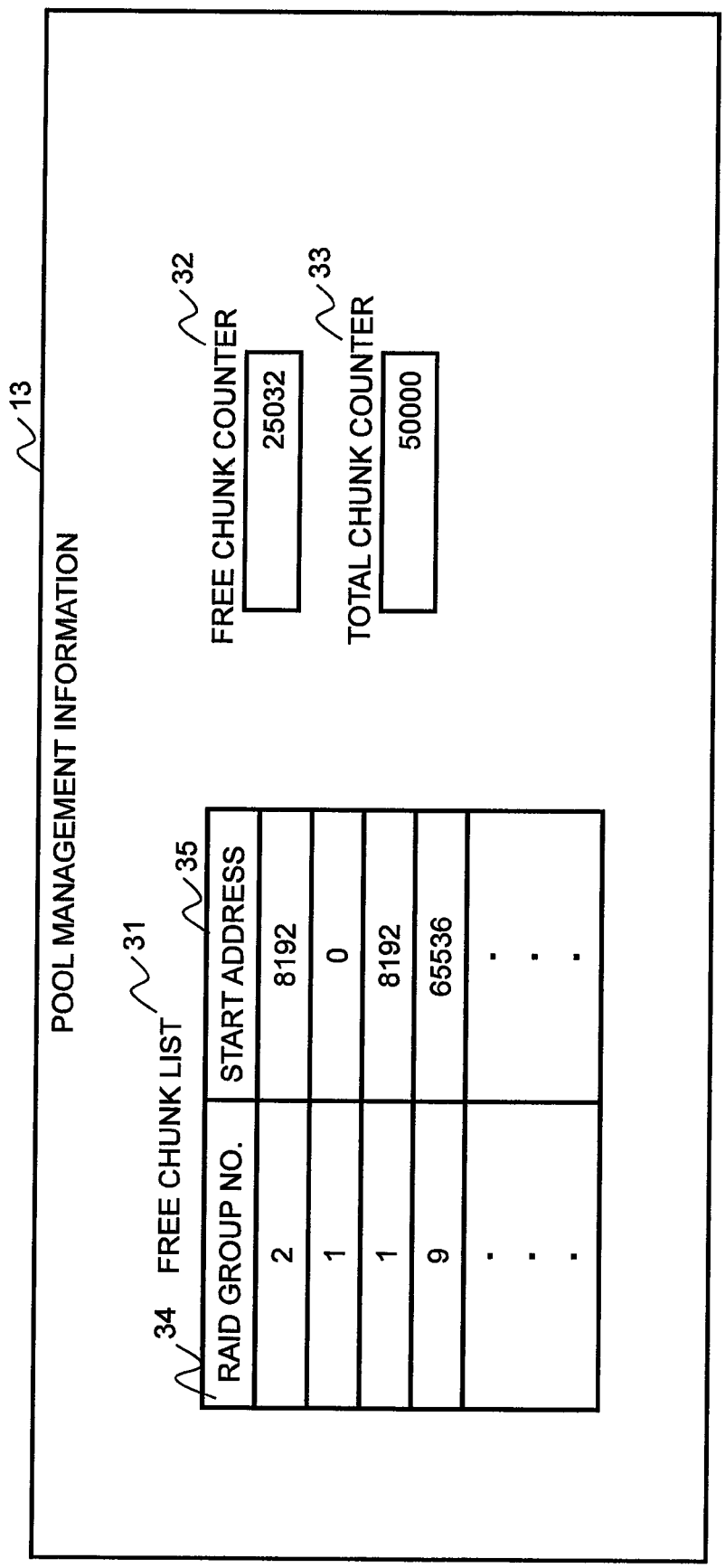
FIG. 3 is a diagram showing an example of pool management information 13.

FIG. 3 is a diagram showing an example of the pool management information 13.

The pool management information 13 exists for each pool. The pool management information 13 includes a free chunk list 31 for managing the free chunks (unallocated physical chunks) inside the pool (referred to as a "target pool" in the explanation of FIG. 3 below) corresponding to this information 13, a free chunk counter 32 for storing the number of free chunks inside the target pool, and a total chunk counter 33 for storing the total number of physical chunks configuring the target pool. The free chunk list 31 juxtaposes a free chunk RAID group number 34 and start address 35.

Figure 4:
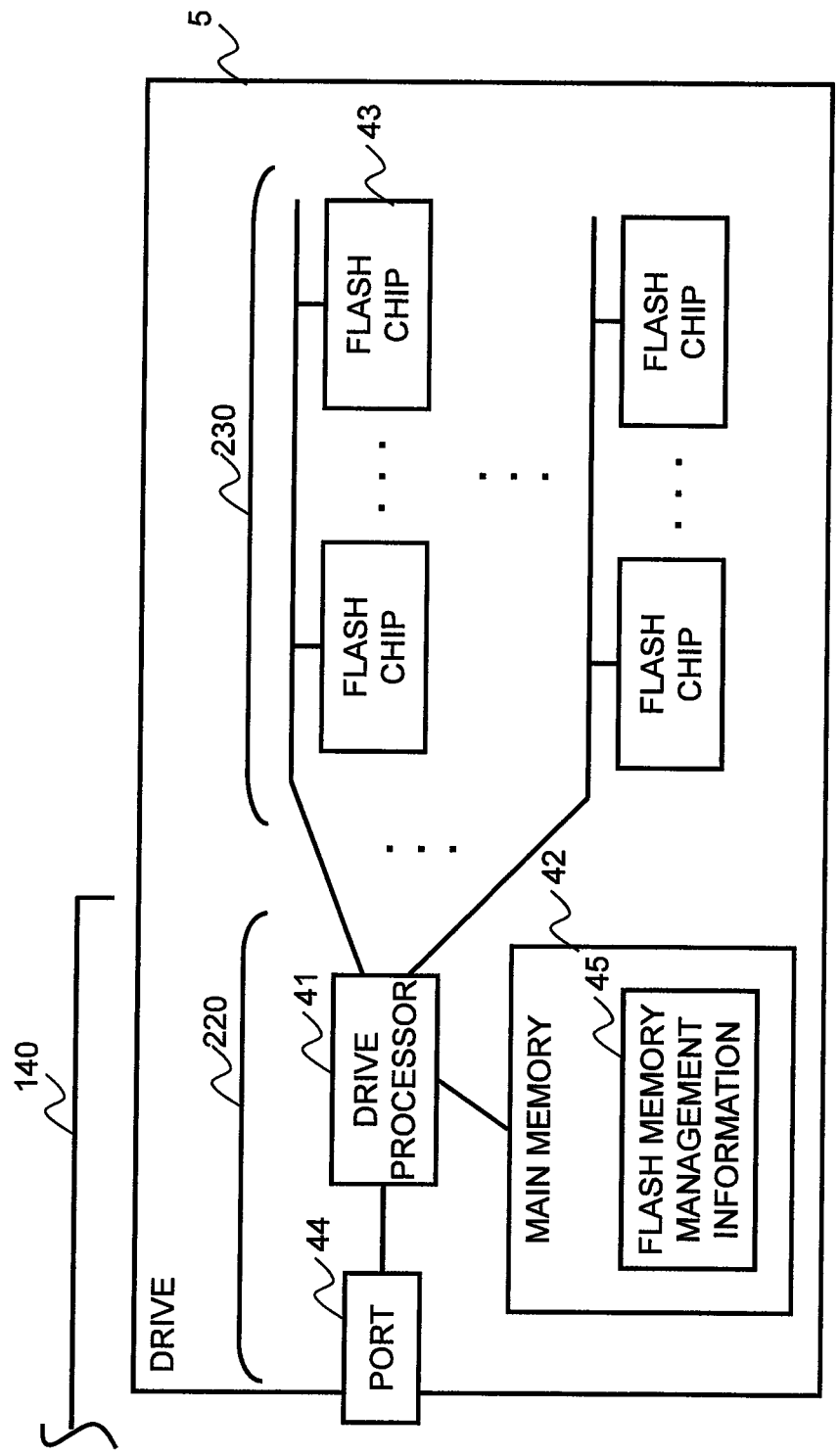
FIG. 4 is a diagram showing an example of the configuration of a drive 5.

FIG. 4 is a diagram showing an example of the configuration of the drive 5.

The drive 5 includes a drive controller 220 and a flash package 230. The flash package 230 includes a plurality of flash chips 43.

The drive controller 220 includes one or more processors (drive processors) 41 for controlling the drive, a main memory 42 for holding data and a program for carrying out the control, and one or more ports 44 for exchanging data with the storage controller 4.

The main memory 42 stores flash memory management information 45 including information related to the flash chip 43 (each of flash chips 43). Furthermore, the main memory implementation method is not limited to the mode of FIG. 4.

For example, the main memory 42 may be built into the circuit including the drive processor 41, or one part of the area of the flash package 230 may be used as the main memory 42.

Figure 5:
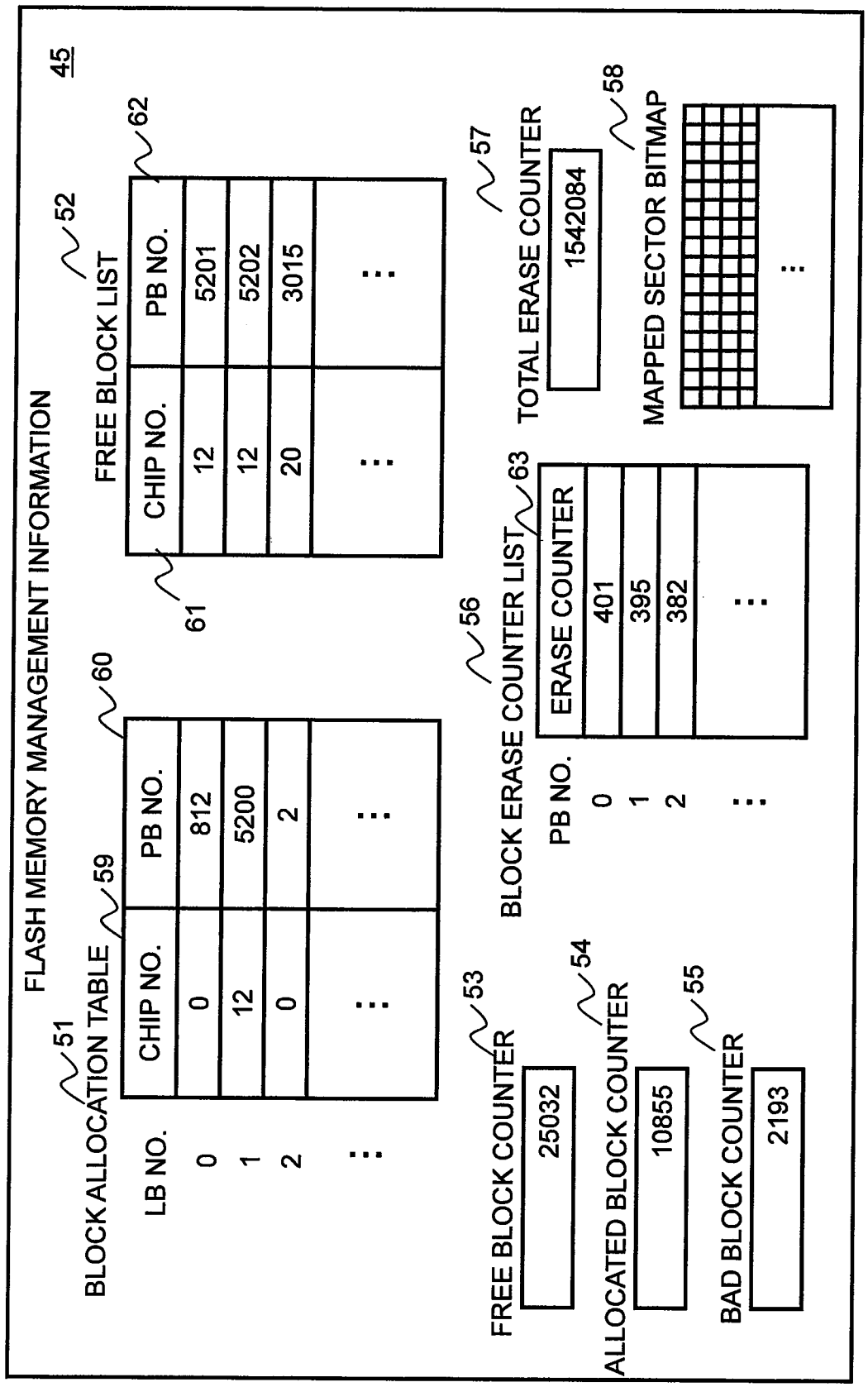
FIG. 5 is a diagram showing an example of flash memory management information 45.

FIG. 5 shows an example of the flash memory management information 45. Furthermore, in FIG. 5, a logical block is abbreviated as "LB", and a physical block is abbreviated as "PB".

The flash memory management information 45 includes a block allocation table 51, a free block list 52, a free block counter 53, an allocated block counter 54, a bad block counter 55, a block erase counter list 56, a total erase counter 57, and a mapped sector bitmap 58.

The block allocation table 51 denotes the corresponding relationship between each logical block and the physical block allocated to each logical block. The physical block information, for example, is configured from a chip number 59 and a block number 60. The information 59 and 60, which corresponds to a logical block to which a physical block has not been allocated, is an invalid value (for example, NULL). The information 59 and 60 will be explained by giving a single physical block (called a "target physical block" below in this paragraph) as an example. The chip number 59 is the number of the flash chip 43 including the target physical chunk. The block number 60 is the number denoting the target physical block.

The free block list 52 juxtaposes a chip number 61 and a block number 62 of a free chunk (an allocatable physical block).

The free block counter 53 stores the number of free blocks.

The allocated block counter 54 stores the number of physical blocks that are allocated to logical blocks.

The bad block counter 55 stores the number of bad blocks (physical blocks that have become unusable and unallocatable due to a failure or end of service life).

The block erase counter list 56 is a block erase counter 63 list that stores the erase count for each physical block.

The total erase counter 57 is for storing the total erase count that has taken place inside the relevant drive. In other words, the value of the counter 57 (the total erase count) is the total of all the erase counters 63 (all the erase count). Each time an erase process is carried out with respect to any physical block inside the drive 5, the drive controller 220 increments the value of the block erase counter 63 corresponding to this physical block by 1, and increments the value of the total erase counter 57 by 1. The value of the total erase counter 57, for example, is one of the factors used in determining a migration-destination RAID group, which will be explained further below.

The mapped sector bitmap 58 is for denoting whether or not it is necessary to allocate a physical storage area to the respective logical sectors inside the drive 5. Each logical block may comprise a plurality of sectors, and each sector may comprise a plurality of logical blocks. That is, the logical block may be larger than the sector, or the sector may be larger than the logical block. For example, in a case where a write instruction specifying the sector 0 address has been received from a higher-level device (the storage controller 4), the drive controller 220 updates the bit 0 (a bit inside the mapped sector bitmap 58) corresponding to this sector 0 to ON (1). By contrast, in a case where an unmap instruction specifying the sector 0 address has been received from the storage controller 4, the drive controller 220 updates the above-mentioned bit 0 to OFF (0).

The flow of processing for accessing a physical block from the storage controller 4 will be explained below. Furthermore, the storage controller 4 manages the corresponding relationship (the pool allocation table 21) as to which physical chunk is allocated to which logical chunk. The storage controller 4 may also manage the corresponding relationship (a chunk/block corresponding relationship) as to which two or more logical blocks are allocated to which physical chunk.

The storage controller 4, upon receiving a write request from the host computer 2, determines on the basis of the pool allocation table 21 whether or not a physical chunk is allocated to the logical chunk (the write-destination logical chunk) identified from this write request. When the result of this determination is negative, the storage controller 4 allocates a free chunk (an unallocated physical chunk) to the write-destination logical chunk, and writes the data appended to the write request to the allocated physical chunk.

The storage controller 4, in a case where data is to be written to the physical chunk, sends a write instruction specifying the address identified on the basis of the information 24 and 25 with respect to this physical chunk to the drive controller 220 managing this address. The drive controller 220, which receives this write instruction, determines based on the block allocation table 51 (that is, the corresponding relationship of the blocks), whether or not a physical block is allocated to the logical block (the write-destination logical block) having the address specified in this write instruction. When the result of this determination is negative, the drive controller 220 selects a free block on the basis of the free block list 52, allocates this free block to the write-destination logical block, and writes the data targeted by this write instruction to the allocated physical block (the free block).

The storage controller 4, upon receiving a read request from the host computer 2, identifies on the basis of the pool allocation table 21 the physical chunk allocated to the logical chunk (the read-source logical chunk) identified from this read request. The storage controller 4 reads the data from the identified physical chunk, and sends the read data to the host computer 2.

The storage controller 4, upon reading out the data from the physical chunk, sends a read instruction specifying an address identified on the basis of the information 24 and 25 with respect to this physical chunk to the drive controller 220 managing this address. The drive controller 220, which receives this read instruction, identifies on the basis of the block allocation table 51 the physical block that is allocated to the logical block having the address specified in this read instruction. The drive controller 220 reads the data from the identified physical block, and sends this data to the storage controller 4.

The processing executed by this embodiment will be explained below. Furthermore, in the following explanation, the processing carried out by the drive controller 220 is executed by the drive processor 41, and the processing carried out by the storage controller 4 is executed by the MP 6.

Figure 6:
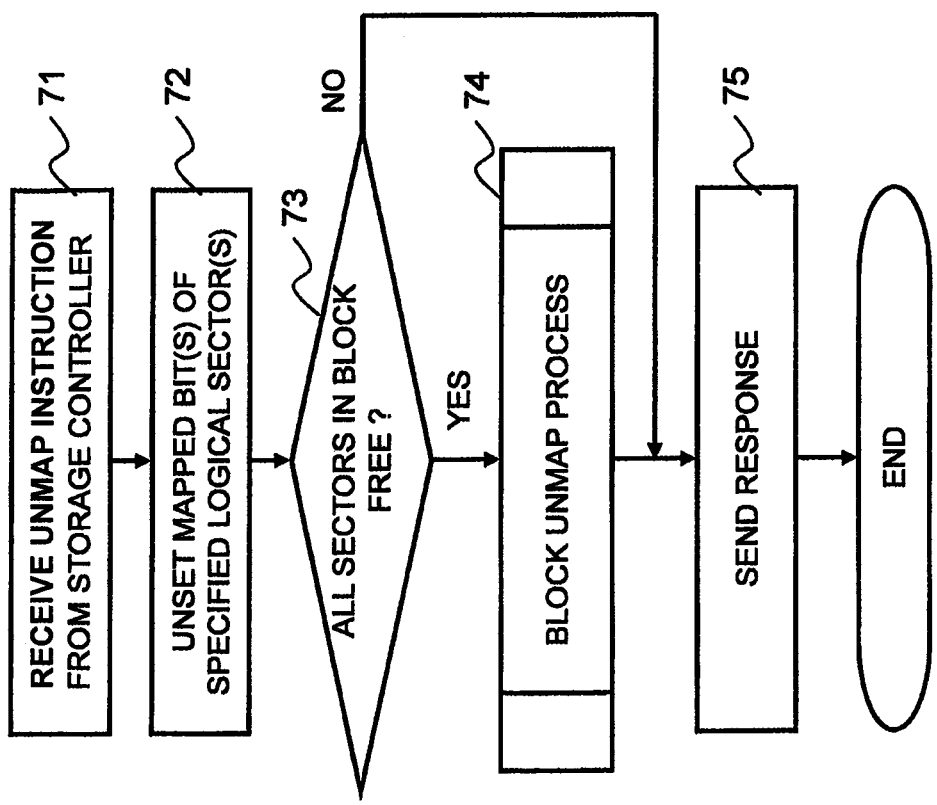
FIG. 6 is a flowchart showing an example of a sector unmap process carried out by a drive controller 220.

FIG. 6 is a flowchart showing an example of a sector unmap process.

The drive controller 220 receives an unmap instruction from the storage controller 4 (Step 71). The unmap instruction includes a group of parameters denoting the address range of the unmap target. The group of parameters, for example, includes a first address (LBA (Logical Block Address)) of the region to be unmapped in the drive 5, and the size (the number of sectors) of the region to be unmapped.

The drive controller 220 updates the bit (a bit inside the mapped sector bitmap 58) corresponding to the logical sector included in the address range specified in this unmap instruction to OFF (0) (Step 72).

The drive controller 220 determines whether or not all the logical sectors inside the logical block are in the unallocated state (OFF (0)) (Step 73). When the result of this determination is affirmative (Step 73: YES), the drive controller 220 carries out a block unmap process for unmapping the physical block (called the unmap-targeted block below) allocated to this logical block from this logical block (Step 74).

Thereafter, the drive controller 220 sends a response to the storage controller 4 (Step 75).

Figure 7:
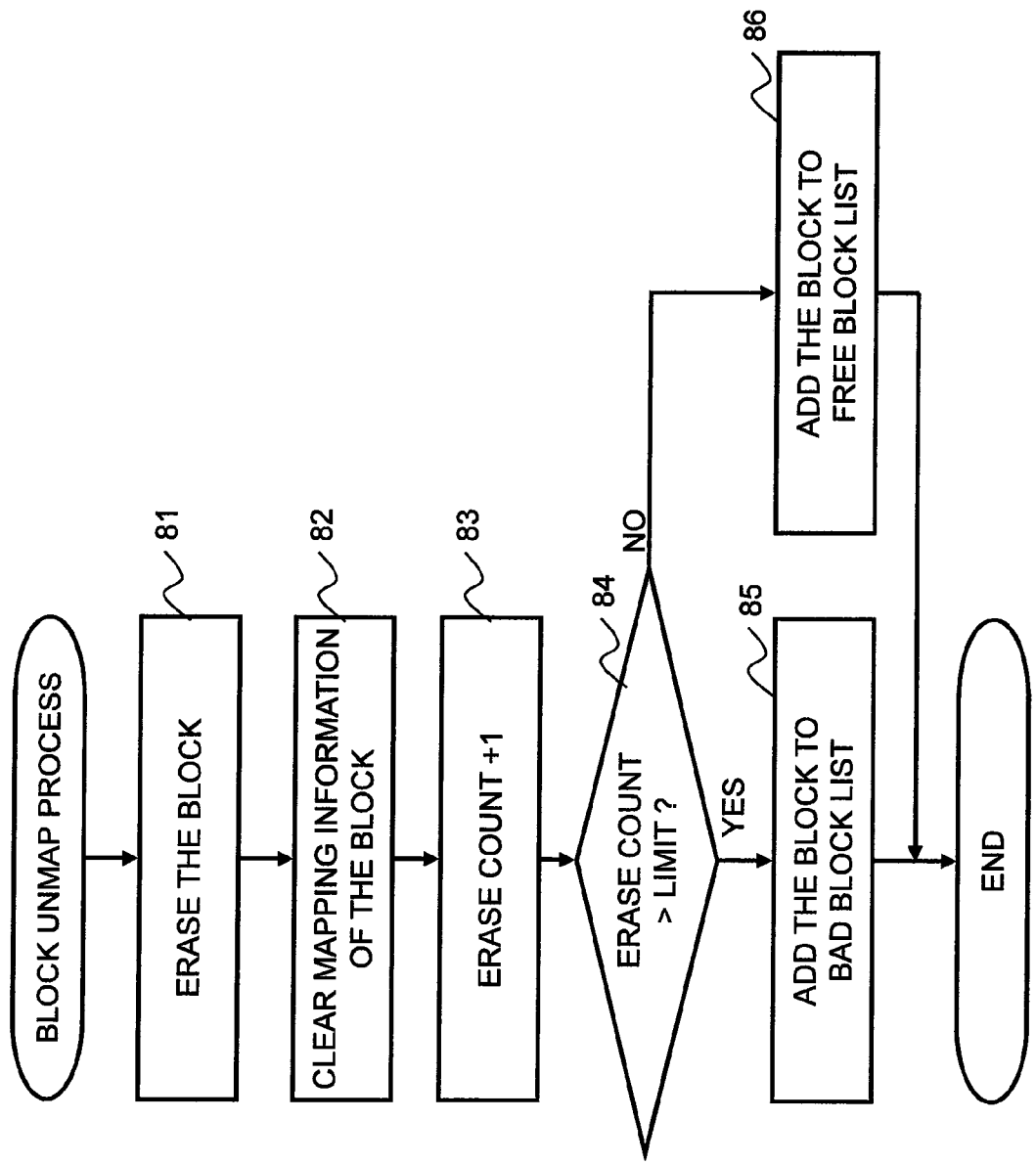
FIG. 7 is a flowchart showing an example of a block unmap process (Step 74 of FIG. 6)

FIG. 7 is a flowchart showing an example of a block unmap process (Step 74 of FIG. 6).

The drive controller 220 carries out an erase process with respect to the unmap-targeted block (Step 81). The erase process is not limited to this timing, and may be carried out at a different timing.

Next, the drive controller 220 clears the mapping information of the unmap-targeted block (Step 82). Specifically, for example, the drive controller 220 updates the information 59 and 60 (the information inside the block allocation table 51) corresponding to the unmap-targeted block to NULL. The drive controller 220 increments the erase count of the unmap-targeted block by 1.

Next, the drive controller 220 determines whether or not the erase count (the value of the erase counter 63) of the unmap-targeted block exceeds an upper limit value (Step 84).

When the result of the determination of Step 84 is affirmative (Step 84: YES), the drive controller 220 manages the unmap-targeted block as a bad block. Specifically, the drive controller 220 adds the chip number and block number of the unmap-targeted block to a bad block list (Step 85). Furthermore, the bad block list, although not shown in the drawing, is a list that is included in the flash memory management information 45, and has the same configuration as the free block list 52.

When the result of the determination in Step 84 is negative (Step 84: NO), the drive controller 220 manages the unmapped physical block as a free block. Specifically, the drive controller 220 adds the chip number and block number of the unmapped physical block to the free block list 52 (Step 86).

One example of a trigger for the storage controller 4 to send the unmap instruction to the drive 5 may be the management server 3 sending a logical unit removal request to the storage controller 4. In accordance with this, the storage controller 4 unmaps all the physical chunks allocated to the removal request-targeted logical unit. Then, in this chunk unmap process, the storage controller 4 sends an unmap instruction to the drive 5.

Figure 8:
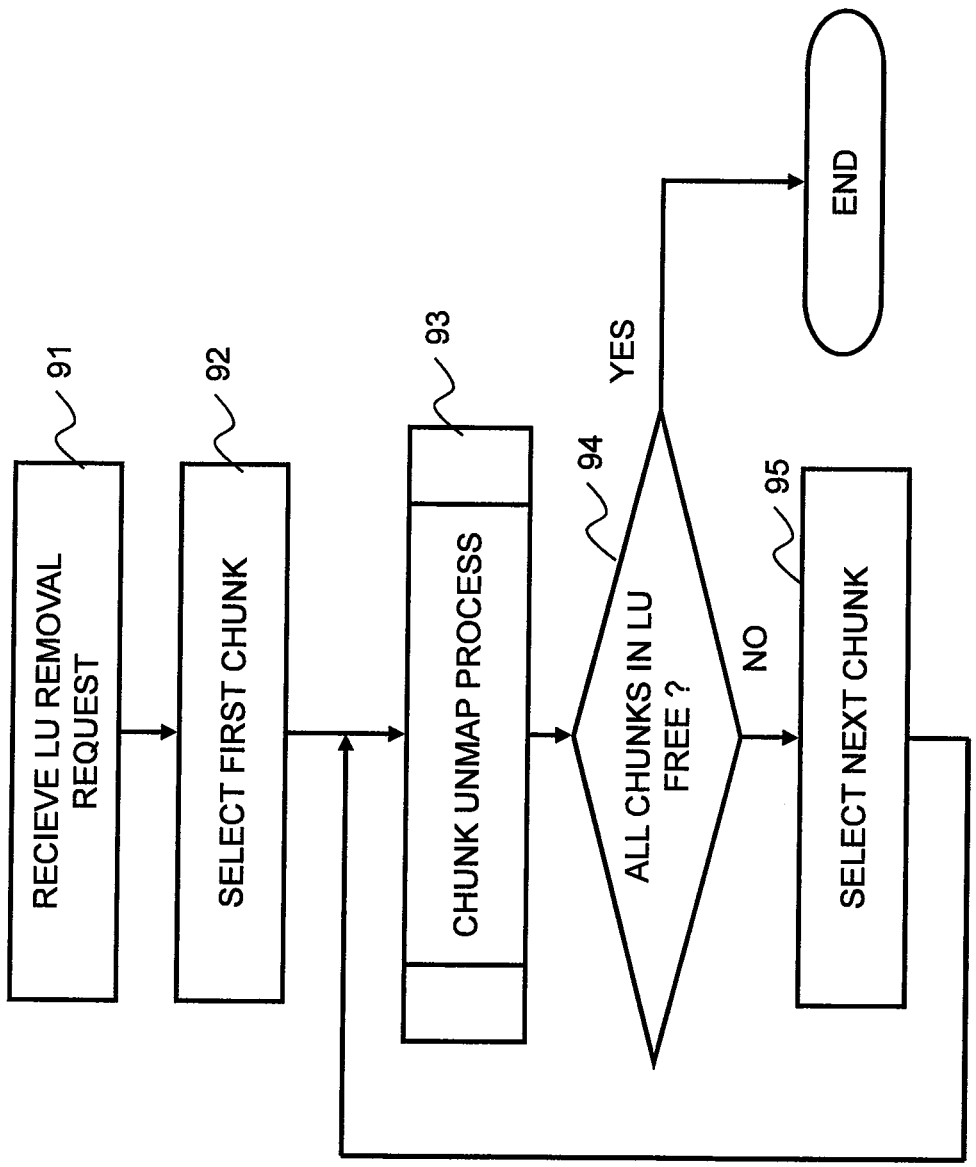
FIG. 8 is a flowchart showing an example of a logical unit removal process.

FIG. 8 is a flowchart showing an example of a logical unit removal process.

The storage controller 4, upon receiving a logical unit (LU) removal request (Step 91), selects as the process-targeted logical chunk the first logical chunk of the logical unit (the target logical unit) specified in this request (Step 92).

Next, the storage controller 4 carries out a chunk unmap process (refer to FIG. 9) for unmapping the physical chunk from the process-targeted logical chunk (Step 93).

In a case where the physical chunk has been unmapped from all the logical chunks inside the target logical unit (Step 94: YES), the storage controller 4 ends the processing. When this is not the case (Step 94: NO), the storage controller 4 selects the next logical chunk as the process-targeted logical chunk (Step 95), and repeats the processing from Step 93.

Figure 9:
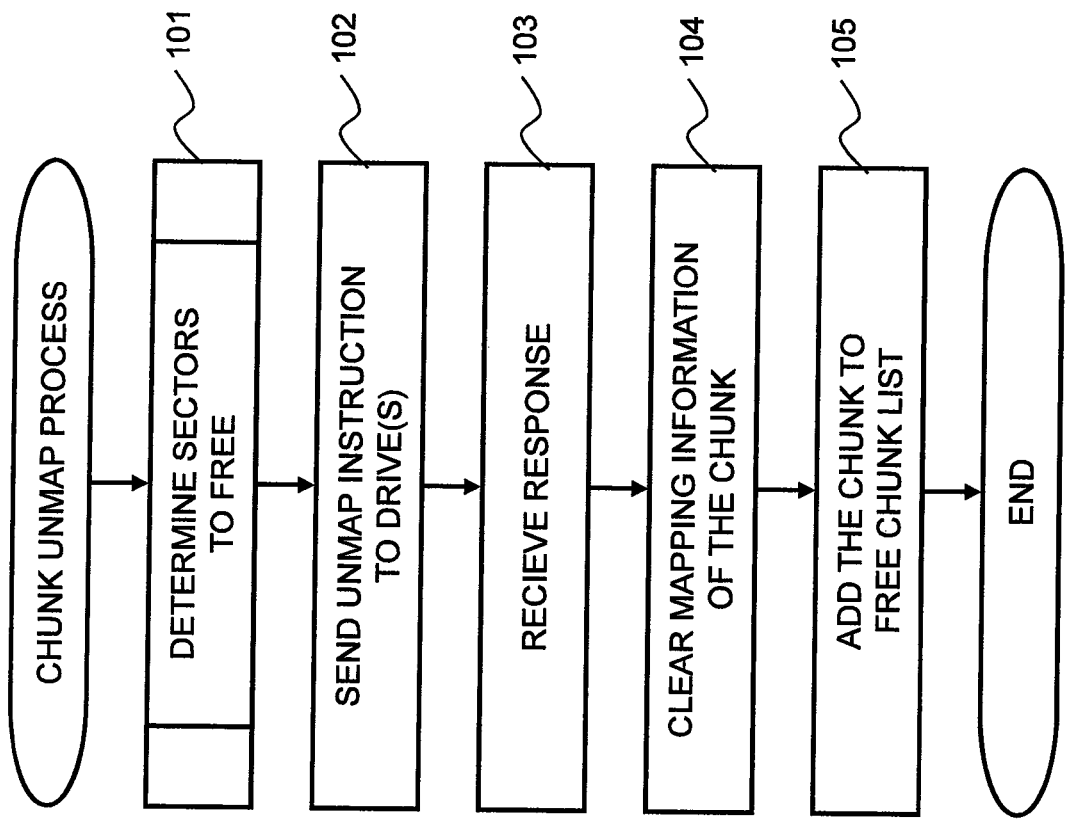
FIG. 9 is a flowchart of a chunk unmap process (Step 93 of FIG. 8)

FIG. 9 is a flowchart showing an example of the chunk unmap process (Step 93 in FIG. 8).

The storage controller 4 determines the sector to be unmapped (Step 101). The "sector to be unmapped" is a logical sector included in the process-targeted logical chunk, specifically, for example, the logical sector corresponding to the ON bit in the mapped sector bitmap 23.

The storage controller 4 sends an unmap instruction specifying the address range in the drive 5 of the logical sector to be unmapped to the drive 5 managing this address range (Step 102). In a case where the physical chunk spans a plurality of drives 5 configuring the RAID group on which this physical chunk is based, the storage controller 4 sends the unmap instruction to each of these plurality of drives 5.

In response to this unmap instruction, the drive 5 carries out a sector unmap process (refer to FIG. 6), and the storage controller 4 receives a response from the drive 5 (Step 103).

Then, the storage controller 4 manages the physical chunk allocated to the process-targeted logical chunk as unallocated. Specifically, the storage controller 4 updates the RAID group number 24 and the start address 25 (the information inside the pool allocation table 21) corresponding to the process-targeted logical chunk to NULL (Step 104). Then, the storage controller 4 adds the RAID group number and the start address of the physical chunk allocated to this logical chunk to the free chunk list 31 (Step 105).

According to the above explanation, the present invention is not limited to the removal of a logical unit, and, for example, in a case where a physical chunk is dynamically unmapped from any logical chunk, it is also possible to unmap the physical block from the logical block belonging to this physical chunk.

Next, another example of a trigger for the storage controller 4 to send the unmap instruction to the drive 5 is a case in which the host computer 2 sends the unmap request specifying a certain address range to the storage controller 4.

Figure 10:
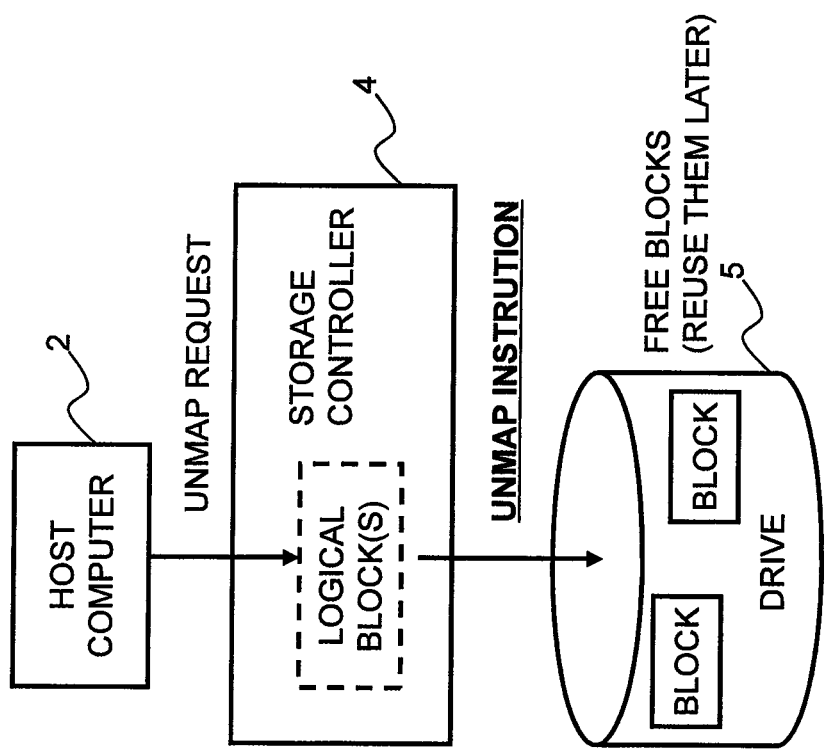
FIG. 10 is a schematic diagram of an example in which a storage controller 4 sends an unmap instruction to the drive 5 in response to an unmap request from a host computer 2.

FIG. 10 is a schematic diagram of an example in which the storage controller 4 sends the unmap instruction to the drive 5 in response to the unmap request from the host computer 2.

Specifically, for example, it is supposed that the file has been removed from the storage space managed by the file system of the host computer 2. In this case, the host computer 2 (for example, either the file system or the operating system) sends to the storage system 1 an unmap request specifying the address range of the area in which the removed file had been stored. That is, the host computer 2 includes a function (an interface) for sending an unmap request specifying the address range of a storage area that the host computer 2 does not need. Consequently, it is possible to let the storage system 1 know about the area that the host computer 2 does not need.

The storage controller 4 receives the unmap request from the host computer 2, and, in response to this unmap request, determines the logical sector (that is, the sector to be unmapped) belonging to the address range specified in this unmap request. The storage controller 4 sends an unmap instruction specifying the address range in the drive 5 of the determined logical sector (that is, an unmap instruction specifying the address range corresponding to the removed file area) to the drive 5 managing this address range.

In response to this unmap instruction, the drive 5 carries out the sector unmap process (refer to FIG. 6). That is, the logical sector managed by the drive 5 is managed as an unmap target in accordance with the address range specified in the unmap instruction, and in a case where all the logical sectors inside the logical block are unmap targets, the physical block is unmapped from this logical block.

Furthermore, the storage system 1, for example, may be a NAS (Network Attached Storage) system. In this case, the storage system 1 can determine the removed file area because the storage system 1 manages the file system.

Figure 11:
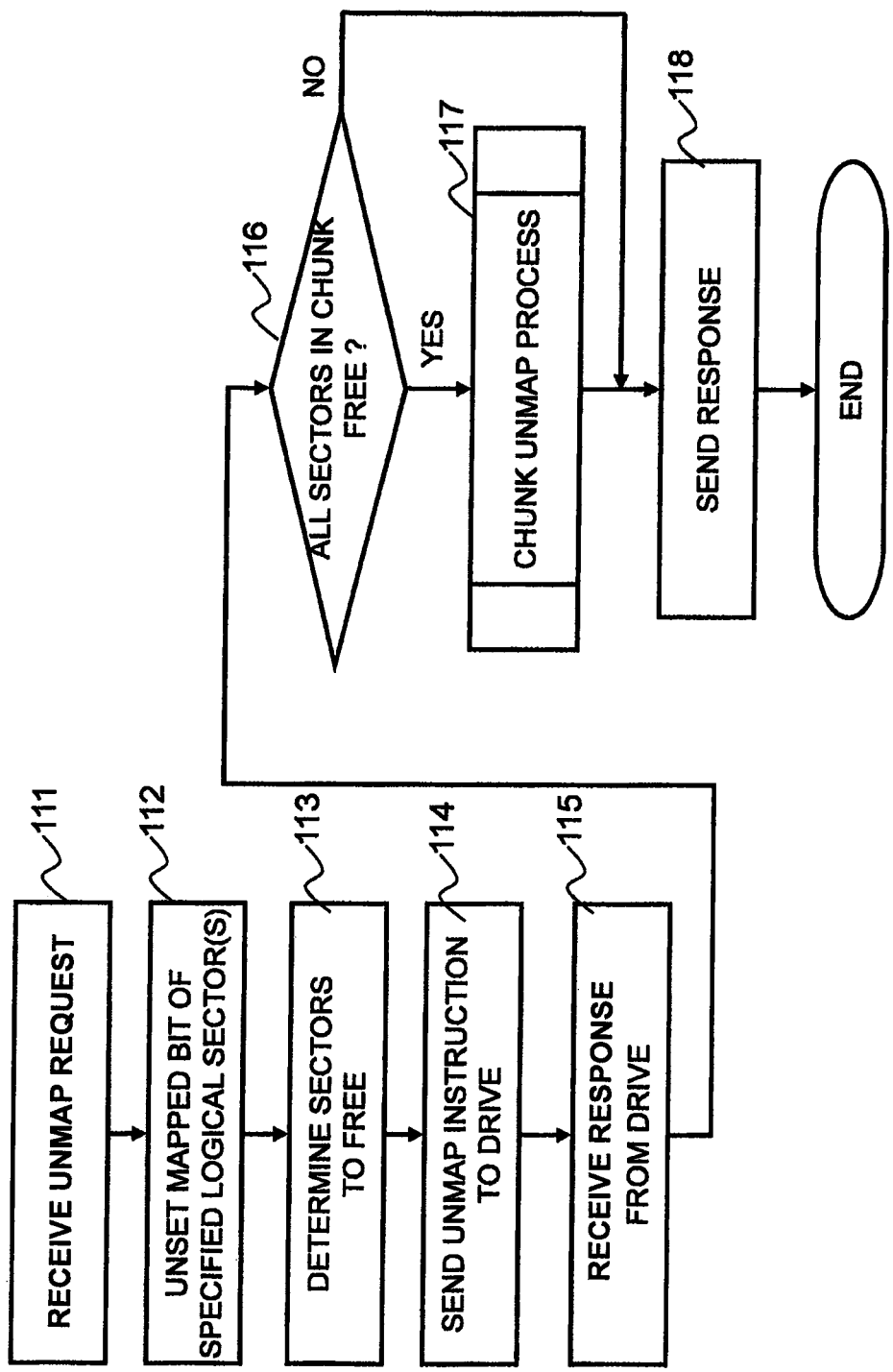
FIG. 11 is a flowchart showing an example of an area unmap process carried out by the storage controller 4 upon receipt of an unmap request from the host computer 2.

FIG. 11 is a flowchart showing an example of an area unmap process carried out by the storage controller 4 upon receiving an unmap request from the host computer 2.

The storage controller 4 receives the unmap request from the host computer 2 (Step 111).

Next, the storage controller 4 updates the bit (a bit inside the mapped sector bitmap 23) corresponding to the address range specified in this unmap request to OFF (0) (Step 112).

Next, the storage controller 4 determines the logical sector to be unmapped based on the address range specified in this unmap request (Step 113). The logical sector determined here is not limited to the logical sectors of the entire area of the address range specified by the host computer 2, but rather is determined on the basis of the RAID type (for example, RAID 5 (3D+1P), RAID 5 (4D+1P)) of the RAID group on which this address range is based. Specifically, in Step 113, the storage controller 4 carries out an unmap region modification process, which will be explained by referring to FIGS. 19 and 20.

Next, the storage controller 4 sends to the drive 5 an unmap instruction specifying the address range in the drive of the logical sector determined in Step 113 (Step 114). In response to this unmap instruction, the drive 5 carries out the sector unmap process (refer to FIG. 6), and the storage controller 4 receives a response from the drive 5 (Step 115).

The storage controller 4 determines whether or not all the logical sectors inside the logical chunk are unmap targets (Step 116). Specifically, the storage controller 4 determines whether or not the bits (bits inside the mapped sector bitmap 23) corresponding to the all the logical sectors of the logical chunk are OFF (0).

When the result of the determination in Step 116 is affirmative, the storage controller 4 carries out the above-mentioned chunk unmap process (refer to FIG. 9) for this logical chunk (Step 117).

Thereafter, the storage controller 4 sends a response with respect to the unmap request to the host computer 2 (Step 118).

However, since the erase count of the flash memory is limited, bad blocks will increase during usage. The increase in bad blocks translates into a reduction of usable physical blocks.

Accordingly, in a case where the usable blocks inside a certain drive 5 have been exhausted, the data is migrated from this drive 5 to another drive, and the physical block is unmapped from the logical block belonging to the data migration-source area. The erase process is carried out for the unmapped physical block, and in a case where the erase count is less than the upper limit value, this physical block is regarded as a free block. Data is able to be written/read to/from a free block. Consequently, the service life of the drive 5 can be expected to lengthen.

Figure 12:
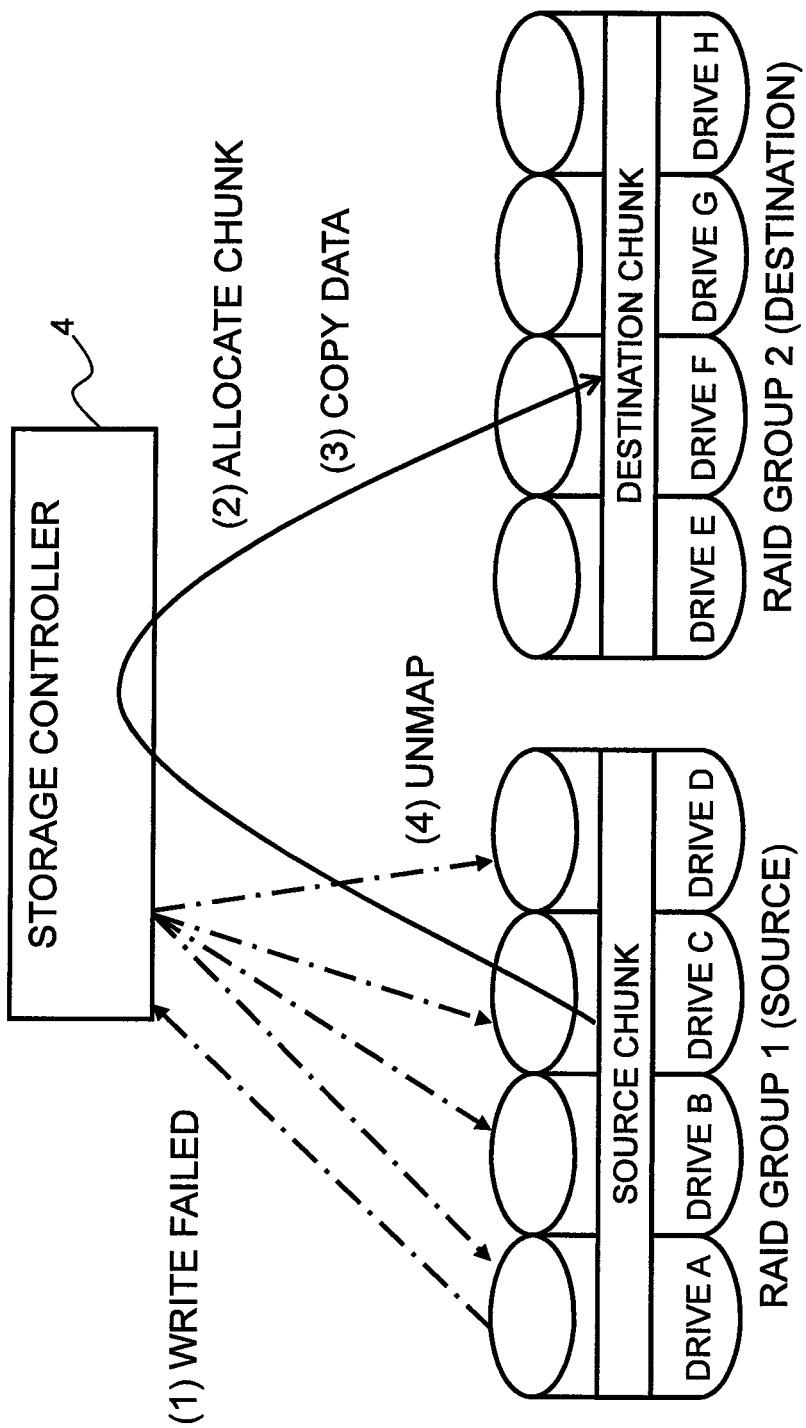
FIG. 12 is a schematic diagram of a data migration process carried out in response to a write error due to a shortage of free blocks.

FIG. 12 is a schematic diagram of a data migration process carried out in response to a write error due to a shortage of free blocks.

For example, in a case where there is a shortage of free blocks in drive A of the drives A through D configuring the RAID group 1, and a data write in drive A failed due to the shortage of free blocks, the drive controller 220 of drive A returns a response including the "error" status as the response to the write instruction from the storage controller 4. In addition to the "error" status, the response includes information denoting that the cause of the error is a shortage of free blocks. Instead of the response including information denoting the cause of the error, the storage controller 4 may acquire the cause of the write error by querying the drive 5 separately.

The storage controller 4 allocates a second physical chunk instead of a first physical chunk to the logical chunk (called a "target logical chunk" in the explanation of FIG. 12 below) to which the physical chunk (the first physical chunk) including the write error range is allocated. The write error range is the address range (the write-destination range) specified in the write instruction corresponding to the write error response, and specifically, is the address range based on drive A. The first physical chunk is the physical chunk (source chunk) based on the RAID group 1. The second physical chunk is the physical chunk (destination chunk) based on the RAID group 2, which is a different RAID group from RAID group 1.

The storage controller 4 migrates the data from the first physical chunk to the second physical chunk. Specifically, the storage controller 4 reads the data which does not remain on cache memory 8 among the data in the first chunk from the drives A through D, and writes to the second physical chunk the data (the data that should be written in the first physical chunk) including the read data and data that had not been written to drive A (for example, data remaining in the cache memory 8).

When the migration has ended, the storage controller 4 sends a logical sector unmap instruction corresponding to the first physical chunk to the migration-source drives A through D. The drives A through D, which receive the unmap instruction at this time, manage the logical sector corresponding to the specified address range as the unmap target.

Furthermore, in this example, the RAID group 1 (the migration-source RAID group) is the RAID group including the write error range, but may also be the RAID group including the drive for which the total erase counter 57 exceeds a predetermined threshold.

Figure 13:
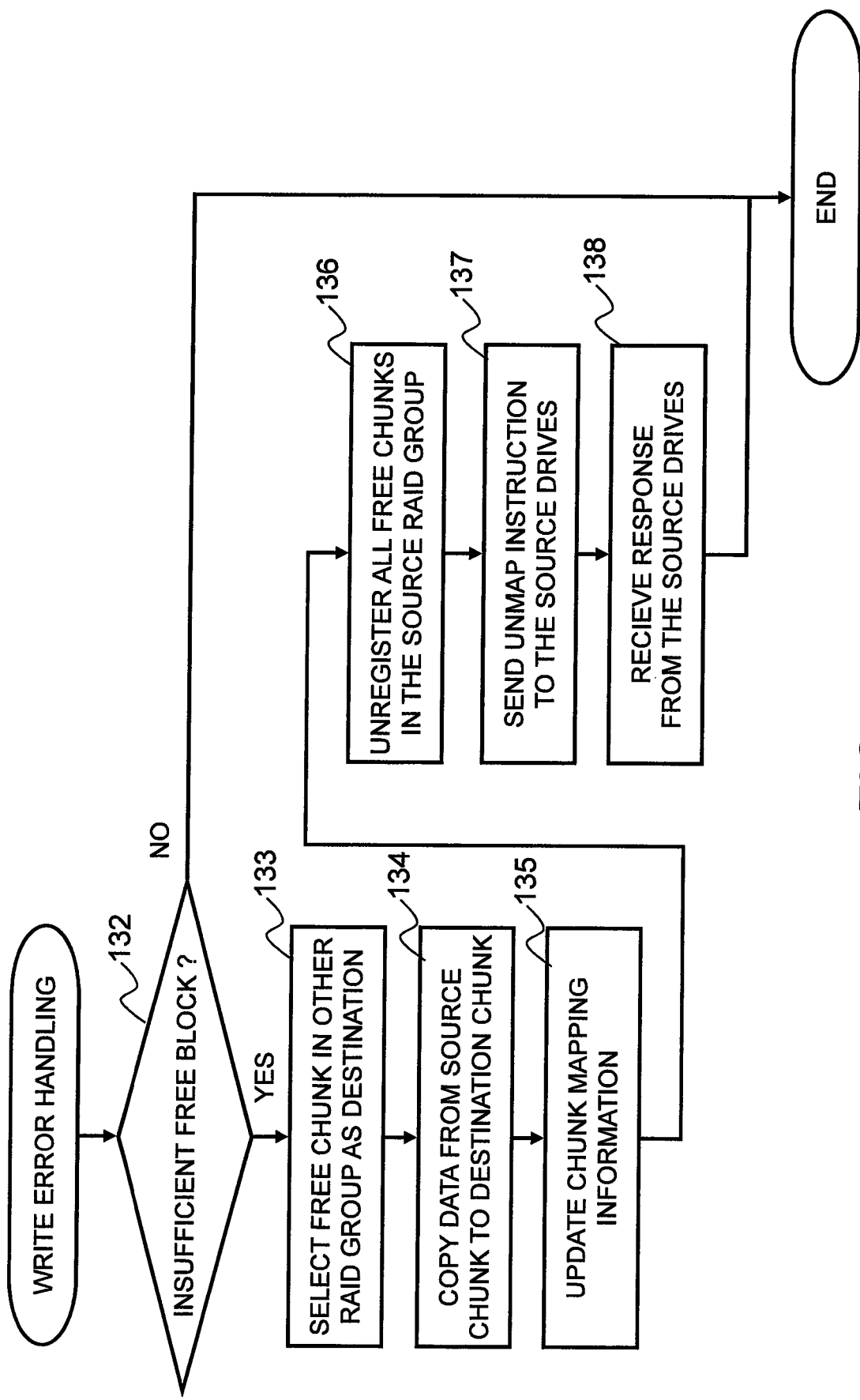
FIG. 13 is a flowchart showing an example of a write error handling process triggered by a write error.

FIG. 13 is a flowchart showing an example of a write error handling process triggered by a write error. The send-source drive 5 of the write error response will be called the "error drive 5", and the RAID group including the error drive 5 will be called the "RAID group 1" below.

The storage controller 4 receives the write error response from the error drive 5, and determines the cause of the write error (Step 132). For example, the storage controller 4 may either analyze the error cause information included in the response, or may identify the cause of the write error by issuing a separate query to the error drive 5.

In a case where the cause of the write error is insufficient free blocks in the error drive 5 (Step 132: YES), the storage controller 4 selects as the migration-destination a free chunk (an unallocated physical chunk) included in the RAID group 2 (Step 133). The RAID group 2 includes more free blocks than (or includes free blocks as many as) the number of free blocks required for storing the data inside the physical chunk, and, in addition, is the RAID group that has the least total erase count of the RAID groups besides the RAID group 1. Specifically, for example, the storage controller 4 checks the number of free blocks and the total erase count of the RAID groups other than the RAID group 1, and from among the RAID groups having a number of blocks in excess of the required number of free blocks (the number of blocks needed to store the data that is inside the physical chunk), selects as the migration-destination the free chunk based on the RAID group having the smallest total erase count. Furthermore, the "number of free blocks in the RAID group" is the smallest value of the values in the free block counter 53 of the respective drives belonging to this RAID group, and is the value arrived at by multiplying the number of drives belonging to the RAID group. The "total erase count of the RAID group" is the largest value of the values in the total erase counter 57 of the respective drives 5 belonging to this RAID group.

Next, the storage controller 4 migrates the data from the physical chunk (migration-source chunk) including the write error range to the physical chunk (the migration-destination chunk) selected in Step 133 (Step 134). The data to be migrated at this time also includes the data for which the write failed. The details are as explained by referring to FIG. 12.

The storage controller 4 updates the pool allocation table 21 (Step 135). Specifically, the storage controller 4 updates the RAID group number 24 and the start address 25 corresponding to the logical chunk allocated to the migration-source chunk from the RAID group number and the start address of the migration-source chunk to the RAID group number and the start address of the migration-destination chunk.

Figure 18:
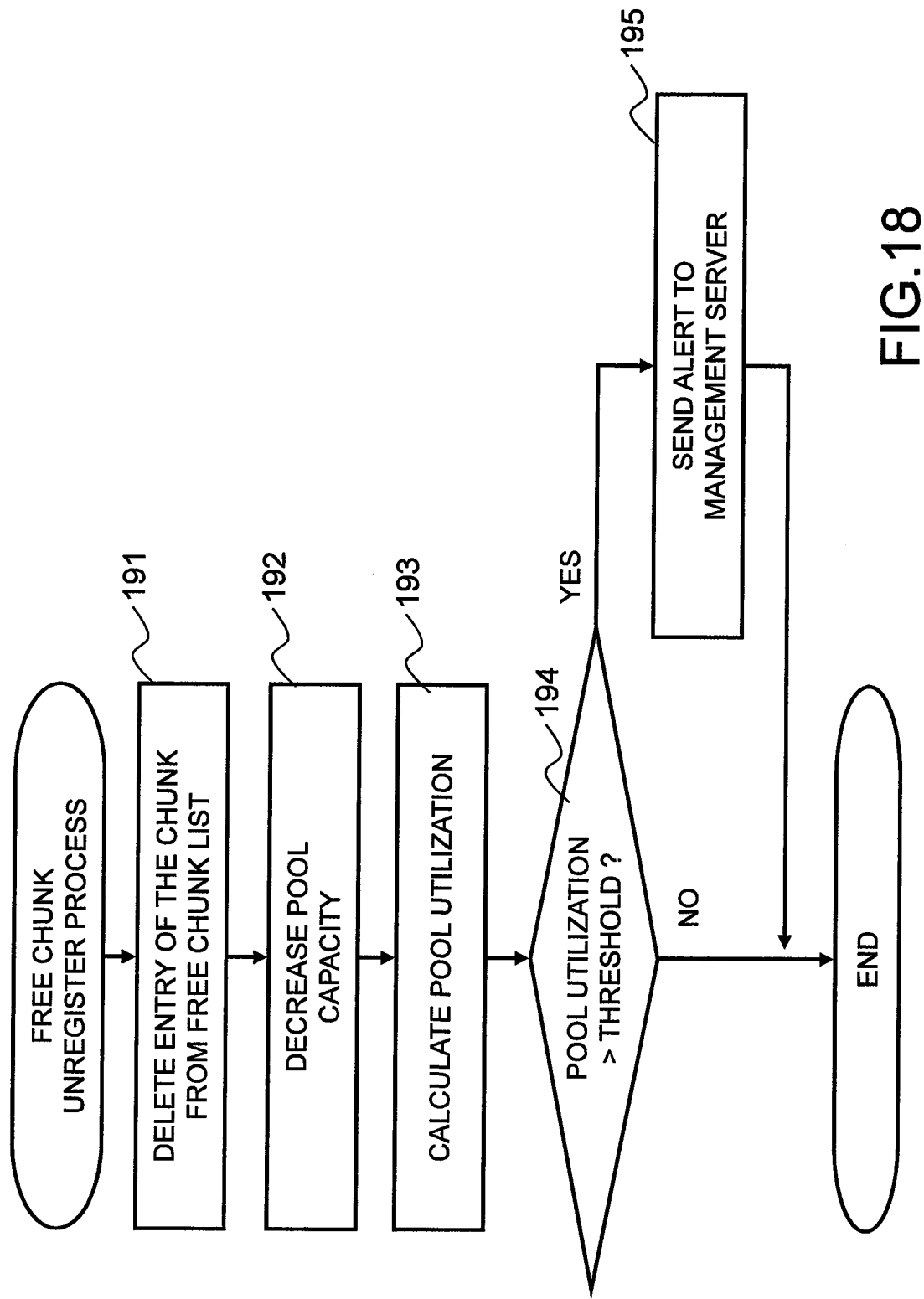
FIG. 18 is a flowchart showing an example of a free chunk unregister process.

Then, the storage controller 4 unregisters all the free chunks based on the RAID group 1 (the migration-source RAID group) from the free chunk list 31 (Step 136). In accordance with this, it is possible to prevent the physical chunk based on the RAID group 1 from being allocated to a logical chunk in the future. Since the write error to the RAID group 1 was caused by insufficient free blocks, the processing of this Step 136 will make it possible to lessen the likelihood of a write failing again in the future due to insufficient free blocks. Furthermore, Step 136 corresponds to Step 191 of FIG. 18. Therefore, when Step 136 is carried out, Step 192 and beyond of FIG. 18 are carried out. In accordance with this, it is possible to issue a warning to the administrator in a case where pool capacity has been exhausted in the wake of Step 136.

Next, the storage controller 4 sends an unmap instruction specifying an address range in the drive 5 of the migration-source chunk and the unregistered chunk with respect to all the drives 5 (the drives 5 inside the RAID group 1) based on the migration-source chunk and the free chunk that was unregistered in Step 136 (unregistered chunk) (Step 137). In accordance with this, a sector unmap process (refer to FIG. 6) is carried out by the respective drives 5, and the storage controller 4 receives the responses to the unmap instruction from these drives 5 (Step 138).

The physical block, which has been unmapped and converted to a free block in the RAID group 1 is allocatable to any logical block based on the RAID group 1. For example, in a case where a data rewrite is frequently carried out with respect to any allocated physical chunk based on the RAID group 1, it is possible to allocate a free block inside the RAID group 1 to a logical block based on this physical chunk.

In this embodiment, in a case where the flash chip 43 inside a certain drive 5 fails, it is possible to restore the data stored in the bad flash chip 43 (called the "bad chip" below) in accordance with a chip failure handling process, which will be explained below.

Figure 14:
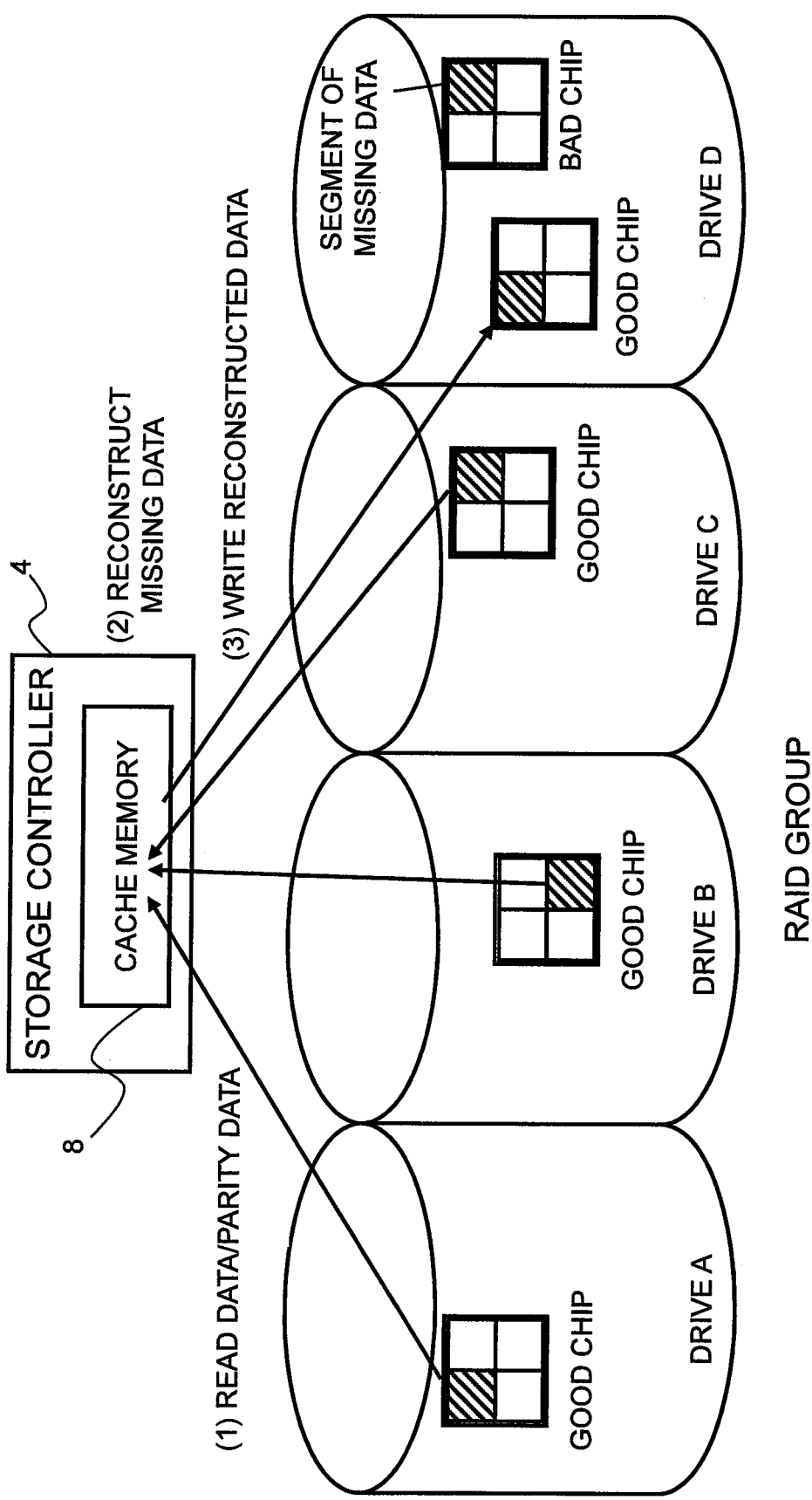
FIG. 14 is a schematic diagram of a flash memory data recovery process for a RAID group of level RAID 5 (3D+1P)

FIG. 14 is a schematic diagram of a flash memory data recovery process for a RAID group of RAID 5 (3D+1P).

In a case where a certain flash chip 43 inside drive D fails, the storage controller 4 carries out (a) through (c) below for each sector data (sector size data) stored in the bad chip:

(a) reads data from the good chips (the chips for which the failure did not occur) inside the other drives A through C, which store the other data inside the dataset including the data inside the bad chip 43;
(b) restores the data inside the bad chip 43 by carrying out a parity operation that makes use of the read data; and
(c) stores the restored data in any good chip inside the drive D including the bad chip 43.

Furthermore, the "dataset" is the unit of data written to the RAID group. For example, in the case of RAID 5, it is the data including a plurality of user data and the parity data created based thereon.

However, since the corresponding relationship between the logical address (LBA) and the physical address (the flash memory chip number/block number) is managed inside the drive 5, the storage controller 4 does not know which logical address data went missing at the point in time that a certain flash chip 43 fails. Accordingly, the storage controller 4 carries out a flash memory data recovery process in accordance with at least one of the below methods:

(Method 1) Queries the drive 5 as to the range of the missing data, and carries out the data recovery process for the replied range;
(Method 2) Carries out the data recovery process for the entire drive 5; and
(Method 3) Executes a read in order from the start of the drive 5, and carries out the data recovery process for the location(s) that cannot be read.

Figure 15:
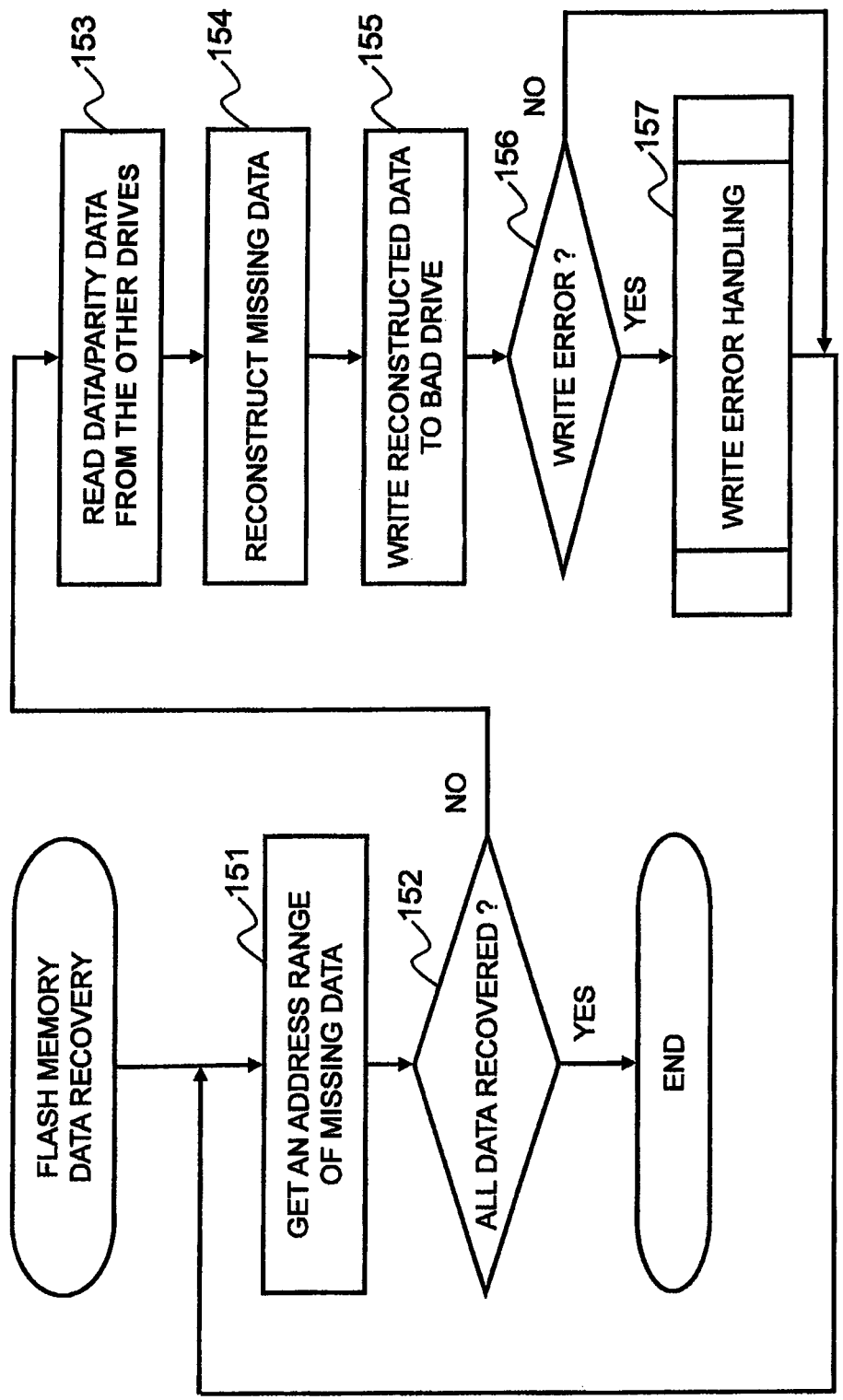
FIG. 15 is a flowchart showing an example of a flash memory data recovery process in accordance with a method 1.

FIG. 15 is a flowchart showing an example of the flash memory data recovery process according to Method 1.

The storage controller 4 acquires from the drive (corresponds to drive D in the example of FIG. 14, and will be called the "bad drive" below) including the bad chip a bad range in the logical address space, that is, an address range for the missing data (the first address and the length (the number of sectors)) (Step 151). A scheme whereby a list of all the bad ranges is acquired at once at this time is conceivable, but in this example, the bad ranges are acquired one location at a time.

In a case where all the data inside the bad chip of the bad drive has been recovered (Step 152: YES), the drive controller 220 inside the bad drive, for example, returns NULL in response to the query from the storage controller 4. Upon receiving this, the storage controller 4 recognizes that data restoration has ended. When all of the data has been recovered, the storage controller 4 ends this flash memory data recovery process.

By contrast, in a case where a bad range remains (Step 152: NO), the storage controller 4 reads the data (either the user data or the parity data) from the other drives inside the RAID group including the bad drive (Step 153).

Next, the storage controller 4 restores the missing data by using the read data to carry out a parity operation (Step 154).

Next, the storage controller 4 writes the restored data to the bad drive (Step 155). The drive controller 220 inside the bad drive writes the restored data to a free block inside a good chip (a normal flash chip) at this time.

However, in a case where the free blocks required for this write do not exist inside the bad drive, there is the likelihood that the write will fail.

In a case where the write fails (Step 156: YES), the write error handling process shown in FIG. 13 is carried out (Step 157). In so doing, it is possible to arbitrarily move the data to another RAID group.

Figure 16:
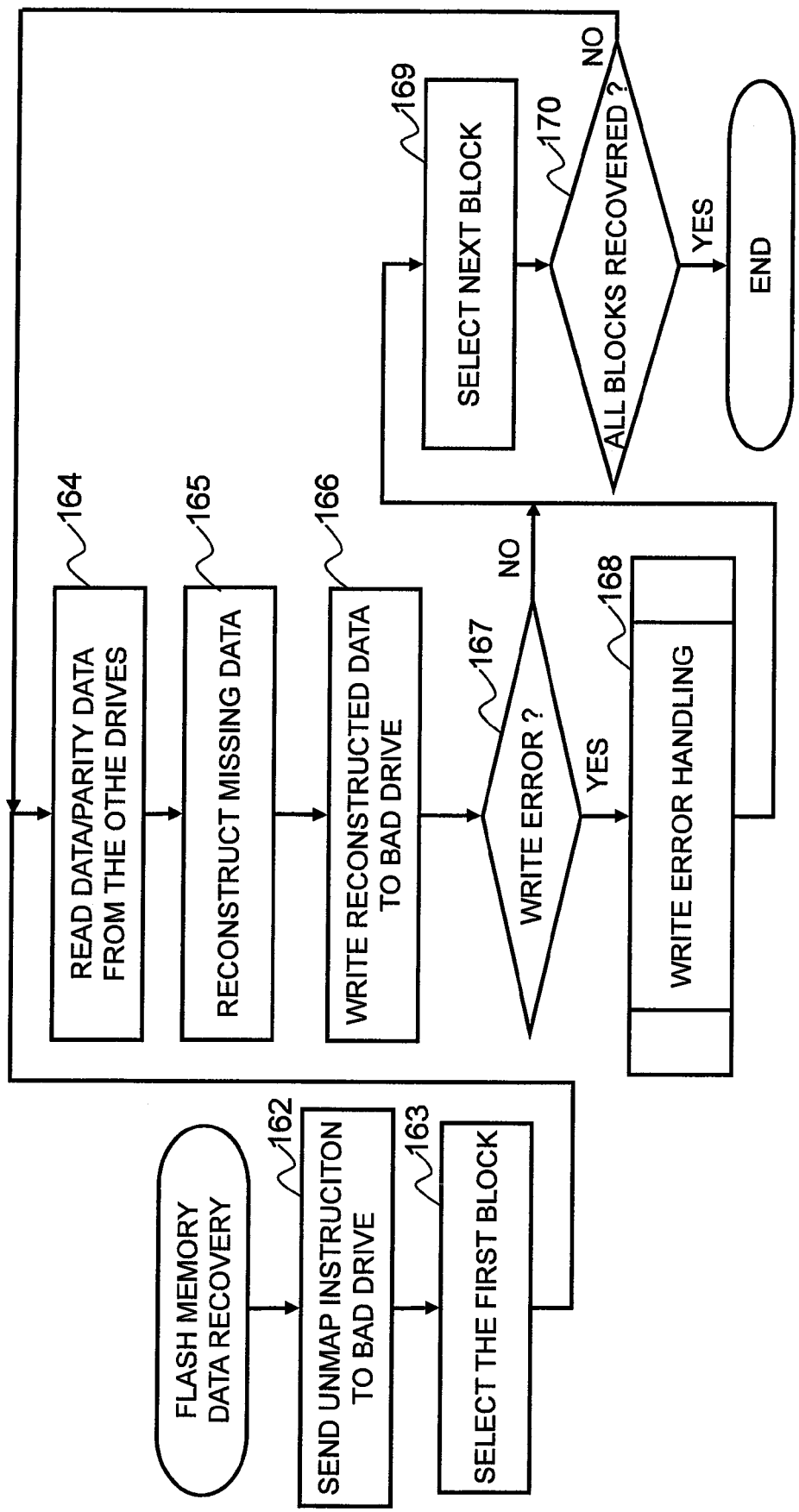
FIG. 16 is a flowchart showing an example of a flash memory data recovery process in accordance with a method 2.

FIG. 16 is a flowchart showing an example of the flash memory data recovery process in accordance with Method 2. According to Method 2, data restoration is executed for the entire bad drive 5.

The storage controller 4 sends to the bad drive an unmap instruction specifying the entire bad drive (Step 162). In accordance with this, the sector unmap process (refer to FIG. 6) is carried out in the bad drive, and all the physical blocks allocated to the entire area of the bad drive (from logical address 0 to the last logical address) are unmapped as a result of this.

Next, the storage controller 4 selects the first logical block of the bad drive as the process target (Step 163).

Next, the storage controller 4 reads the data (either the user data or the parity data) included in the dataset including the data inside the process-targeted logical block selected in Step 163 from the other drives inside the RAID group including the bad drive (Step 164).

Next, the storage controller 4 restores the missing data (the data inside the process-targeted logical block selected in Step 163) by using the read data to carry out a parity operation (Step 165).

Next, the storage controller 4 writes the restored data to the bad drive (Step 166). In a case where the write fails (Step 167: YES), the write error handling process (refer to FIG. 13) is carried out (Step 168).

The storage controller 4 selects the next logical block in the bad drive as the process target (Step 169).

In a case where Steps 164 and beyond have been carried out for all the logical blocks in the bad drive (in a case where it is not possible to select a logical block in Step 169) (Step 170: YES), this flash memory data recovery process will end. In a case where a logical block to be processed still remains (a case where it is possible to select a logical block in Step 169) (Step 170: NO), the processing of Step 164 and beyond is carried out.

Figure 17:
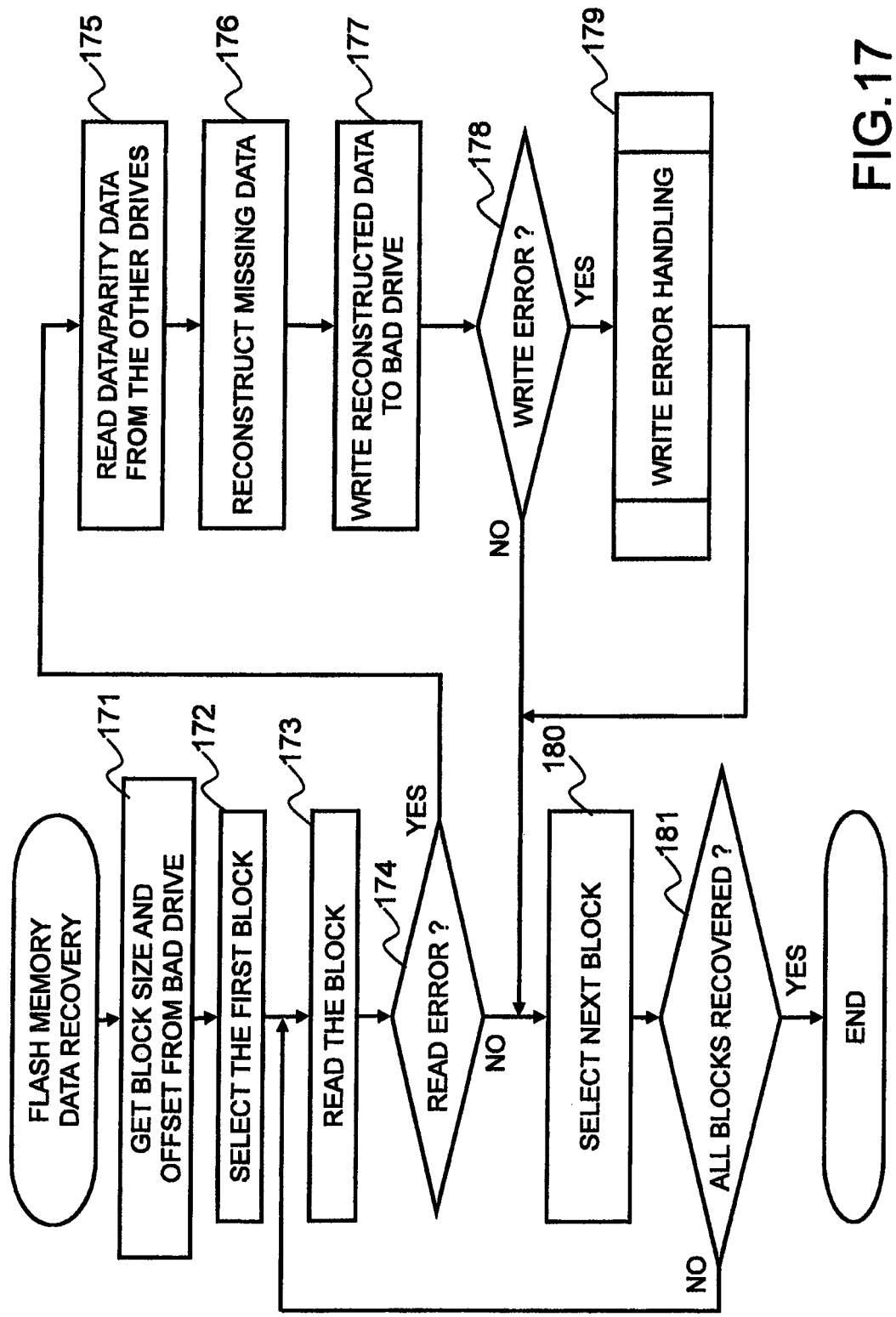
FIG. 17 is a flowchart showing an example of a flash memory data recovery process in accordance with the method 3.

FIG. 17 is a flowchart showing an example of the flash memory data recovery process in accordance with Method 3. According to Method 3, the storage controller 4 carries out a read in order from the start of the bad drive, and carries out a data restoration process for a location that could not be read.

The storage controller 4 acquires information denoting the block size from the bad drive (Step 171).

Next, the storage controller 4 selects the first logical block of the bad drive as the process target (Step 172).

Next, the storage controller 4 reads the data from the process-targeted logical block inside the bad drive (Step 173).

In a case where the read fails (Step 174: YES), the storage controller 4 carries out Steps 175 through 177. That is, the storage controller 4 reads the data (either the user data or the parity data) included in the dataset including the data inside the process-targeted logical block selected in Step 173 from the other drives inside the RAID group including the bad drive (Step 175). The storage controller 4 restores the missing data (the data inside the process-targeted logical block selected in Step 173) by using the read data to carry out a parity operation (Step 176). The storage controller 4 writes the restored data to the bad drive (Step 177). In a case where this write fails (Step 178: YES), the write error handling process (refer to FIG. 13) is carried out (Step 179).

In the case of either Step 174: NO or Step 178: NO, the storage controller 4 selects the next logical block inside the bad drive as the process target (Step 180). In a case where all the logical blocks have been processed (a case where it is not possible to select a logical block in Step 180) (Step 181: YES), this flash memory data recovery process ends. In a case where a logical block to be processed still remains (a case where it is possible to select a logical block in Step 180) (Step 181: NO), the processing of Steps 173 and beyond is carried out.

There are cases in which a free chunk will be unregistered from the free chunk list in line with insufficient free blocks or a flash chip 43 failure inside the drive 5. For this reason, the capacity of the pool will decrease. When there are no longer any free chunks, physical chunk allocation becomes impossible, thereby raising the likelihood that data appended to a write request from the host computer 2 will not be able to be stored. It is preferable that the pool capacity be increased (the free chunks be increased) prior to this happening.

Accordingly, the storage controller 4 computes the pool utilization rate (=pool usage/pool capacity) when a free chunk is unregistered, and in a case where the calculated pool utilization rate exceeds a predetermined threshold, sends a warning to the management server 3. Furthermore, the "pool capacity" is the total capacity of the physical chunks registered in the pool. The "pool usage" is the total capacity of the physical chunks allocated to the logical chunks from among the physical chunks registered in the pool. An opportunity of computing the pool utilization rate might also be the opportunity of increasing pool usage in addition to the above mentioned opportunity.

FIG. 18 is a flowchart showing an example of the free chunk unregister process.

The storage controller 4 deletes the entry of the unregister-targeted physical chunk from the free chunk list 31 (Step 191).

Next, the storage controller 4 subtracts the capacity of the unregistered physical chunk from the pool capacity (Step 192).

Next, the storage controller 4 computes the pool utilization rate (Step 193).

In a case where the calculated pool utilization rate exceeds a predetermined threshold (Step 194: YES), the storage controller 4 sends a warning to the management server 3 (Step 195).

In the storage system 1, in a case where the data (the user data) of a plurality of drives is used to create parity data (for example, an error correction code) (for example, the case of a RAID 5 or a RAID 6), the following scheme is conceivable once the unmap region has been determined.

For example, it is supposed that parity data P1 is created from certain user data D1, D2 and D3, and the respective user data D1 through D3 and the parity data P1 are stored in the four drives (a single RAID group). Further, it is supposed that in a case where the drive 5 receives a read instruction for an unmapped region, the data returned by this drive 5 is uncertain. Then, for example, there could be a case where only the area in which D1 is stored is unmapped in accordance with the unmap request from the host computer 2, and thereafter, the drive in which D2 is stored fails. It is supposed that the storage controller 4 reads the user data D1 and D3 and the parity data P1 from the three drives, and restores the user data D2 at this time, but since the user data D1 is uncertain, there is concern that erroneous data will be constructed.

Therefore, to maintain the integrity of the data, it is necessary to modify the unmap region such that the logical sector (the logical sector managed by the drive) in which the relevant dataset is stored is made the unmap target only in a case where the logical sector (the logical sector in the logical unit) in which all the user data included in the dataset is stored has been unmapped.

Figure 19:
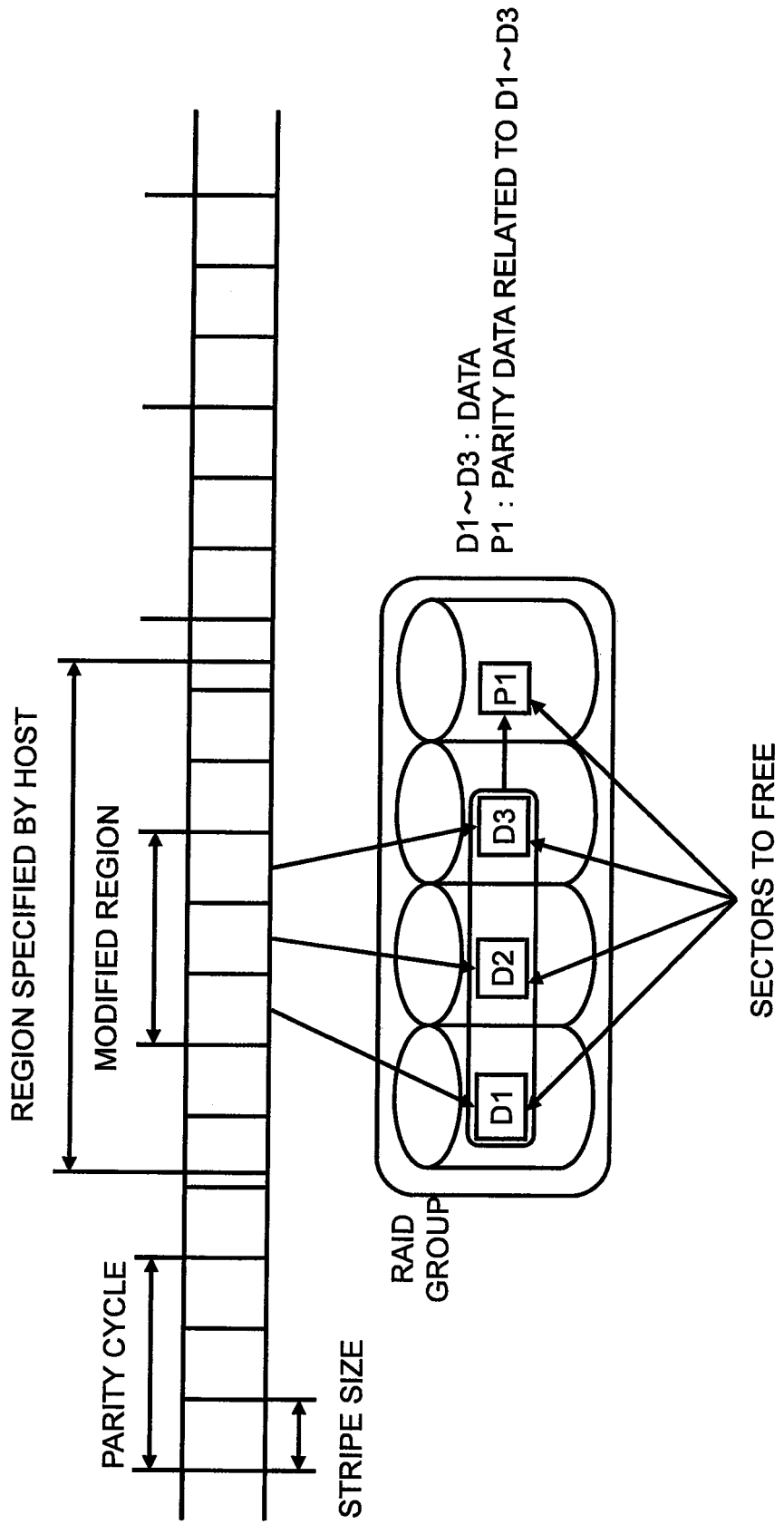
FIG. 19 is a schematic diagram of an example of the modification of an unmap region.

FIG. 19 is a schematic diagram of an example of the modification of an unmap region. Furthermore, this drawing shows an example of a RAID 5 (3D+1P), but the same method may also be applied to another RAID type (the RAID level and/or the number of drives configuring the RAID group).

The RAID group storage space is configured by a plurality of rows of stripes. One row of stripes is configured from a plurality of stripes respectively corresponding to a plurality of drives configuring this RAID group. According to the example of FIG. 19, one row of stripes is configured from four stripes. One stripe is based on one drive. Either user data or parity data is stored in each stripe.

An area corresponding to the plurality of stripes in which a plurality of user data that serves as the basis for the parity data is stored will be called the "parity cycle area" below. According to the example of FIG. 19, since the parity data is created from three stripes, the size of the parity cycle area is three times the stripe size.

For example, in a case where the address range specified in the unmap request from the host computer 2 does not fit within the borders of the range of the parity cycle area, the storage controller 4 corrects this unmap region so that it fits within the borders of the parity cycle. That is, in a case where the unmap region specified by the host computer 2 is unmap region A, the drive 5-specified unmap region B is from the first sector of the first parity cycle area inside the unmap region A to the last sector of the last parity cycle inside the unmap region A.

Figure 20:
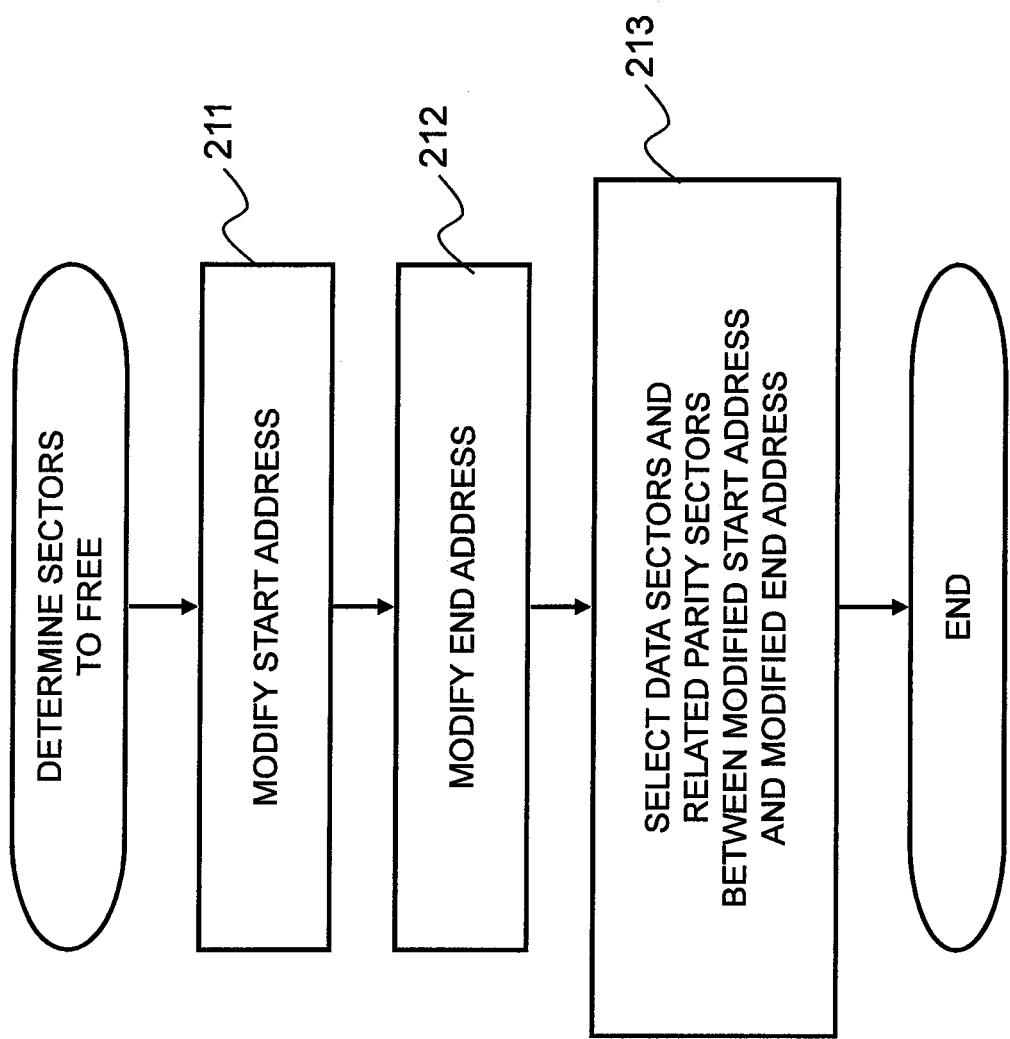
FIG. 20 is a flowchart showing an example of an unmap region modification process.

FIG. 20 is a flowchart showing an example of an unmap region modification process.

First, the storage controller 4 corrects the start address so that this address matches the border of the parity cycle area (Step 211). Specifically, when the start address of the unmap region specified by the host computer 2 is S and the size of the parity cycle area is P, the modified start address S' is found using the following equation (1):

$$S'=\text{int}((S+(P-1))/P) \times P \quad (1)$$

In this regard, int (A) represents a maximum integer not exceeding A.

Next, the storage controller 4 corrects the end address such that it matches the border of the parity cycle area (Step 212). Specifically, when the end address of the unmap region specified by the host computer 2 is E and the size of the parity cycle area is P, the modified end address E' is found using the following equation (2):

$$E'=\text{int}((E+1))/P) \times P-1 \quad (2)$$

Next, the storage controller 4 selects as the sectors to be unmapped the sectors on each drive corresponding to the region from the modified start address S' to the modified end address E', and the sectors on each drive in which parity data corresponding to the data in this region is stored (Step 213). The unmap instruction specifying the address corresponding to the sectors selected here is sent to the drive 5 from the storage controller 4.

The flash memory data recovery process that is carried out when a flash chip 43 fails has been explained by referring to FIG. 14 and so on, but in a case where the cause of the failure has been brought about by changes in the flash chip 43 over time (to include degradation resulting from block erasures) or is caused by common components inside the drive 5, there is the danger of the failure reoccurring in a case where the restored data is stored in the bad drive 5.

Accordingly, in a case where the failure of a flash chip 43 is other than random, the restored data may be stored in a different drive than the bad drive (for example, in a new drive such as a pre-mounted spare drive).

Figure 21:
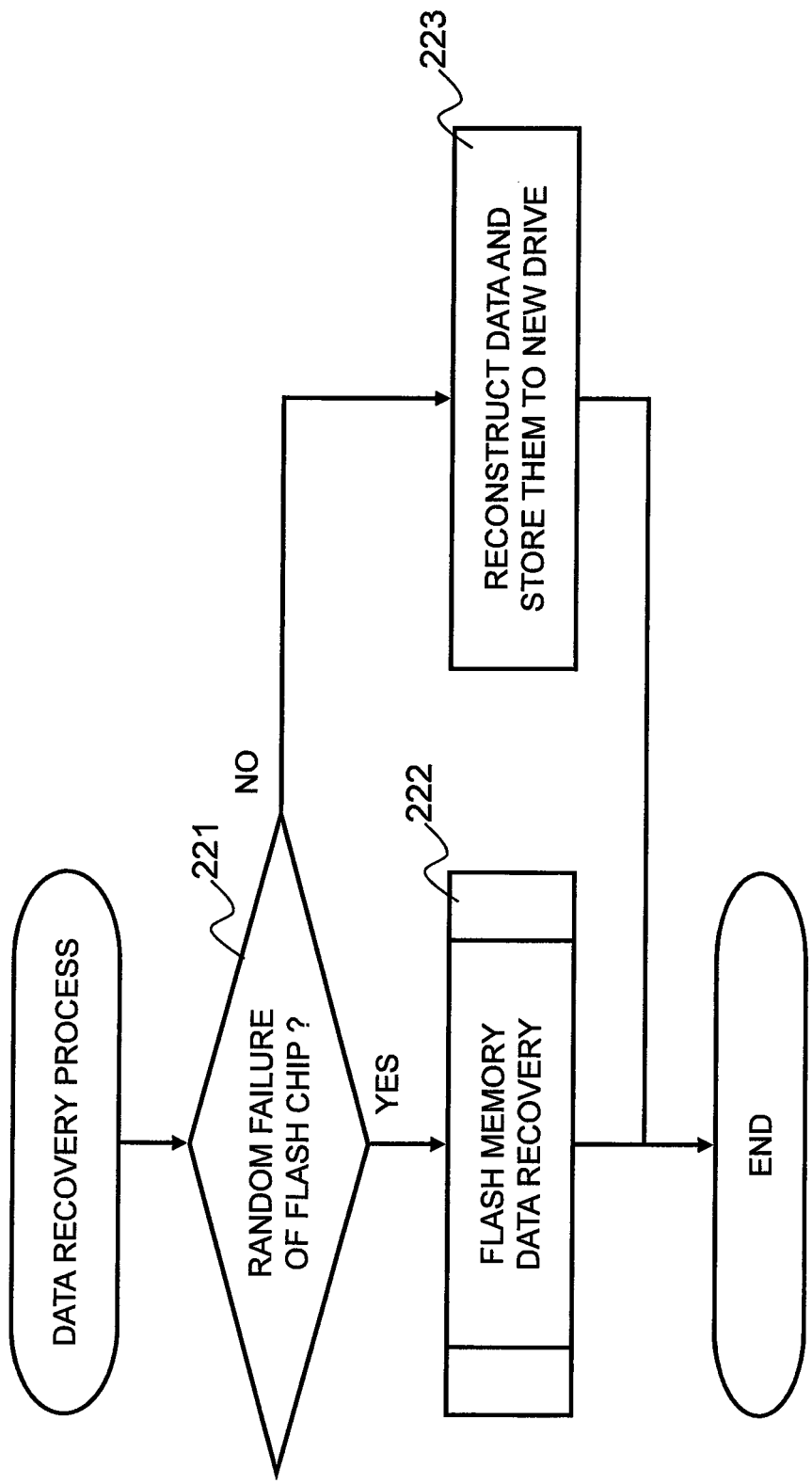
FIG. 21 is a flowchart showing an example of a data recovery process.

FIG. 21 is a flowchart showing an example of a data recovery process.

In accordance with this data recovery process, a determination is made as to whether the already explained flash memory data recovery process should be carried out or whether a different process should be executed without carrying out this flash memory data recovery process.

First, the storage controller 4 determines whether or not the failure that occurred in the drive was a random failure of the flash chip 43 (Step 221). Specifically, for example, the storage controller 4 determines that it was not a random failure in a case where the result of at least one of (X) and (Y) below is affirmative:

(X) whether or not the erase count of the bad drive exceeded a predetermined threshold; and (Y) whether or not a fixed time period had elapsed since the date the bad drive was manufactured.

When the result of the determination of Step 221 is affirmative (Step 221: YES), the above-described flash memory data recovery process (any of the processes of FIGS. 15 through 17) is carried out (Step 222).

By contrast, when the result of the determination of Step 221 is negative (Step 221: NO), the storage controller 4 uses the data stored in the other drives inside the RAID group including the bad drive to restore all the data inside the bad drive, and writes the restored data to a new drive (Step 223).

Now, according to the above explanation, there are a number of triggers for unmapping a physical block, but the present invention is not limited to the above-mentioned triggers, and other triggers are also applicable. For example, the present invention is not limited to the trigger of receiving an explicit request such as an unmap request from the host computer 2, and the unmapping of a physical block may also be carried out upon receiving a non-explicit request signifying that data of a specific pattern (called "pattern data" below) is being written repeatedly. The non-explicit request referred to here may be an ordinary write request for the pattern data to be repeatedly written, or a write-same request (for example, a WRITE SAME command in a SCSI command) that clearly specifies the repeated writing of the pattern data. The write-same request causes a specified pattern data (for example, all 0-bits) to be written to the entire area that has been specified. For example, in a case where the storage controller 4 has decided to send back all 0-bit data relative to a read request specifying an address of a logical chunk to which a real chunk has not been allocated, the storage controller 4 is able to unmap a physical chunk when the data inside this physical chunk has become all 0-bits in accordance with the write-same request. The same is also possible for a block in a drive 5. For example, the flash memory management information 45 may comprise the mapped sector bitmap 58, but this mapped sector bitmap 58 may be omitted in a case where, instead of checking the mapped sector bitmap 58 in Step 73, a check is executed as to whether or not the data inside the relevant block is all zeros.

According to this embodiment, free blocks are efficiently increased. Consequently, the efficiency of the wear-leveling can be expected to improve.

One embodiment of the present invention has been explained above, but this is merely an example for explaining the present invention, and does not purport to limit the scope of the present invention solely to this embodiment. The present invention may also be put into practice in a variety of other modes.

For example, the drive controller 220 may be disposed outside the drive 5. In this case, the number of drive controllers 220 may be either larger or smaller than the number of flash packages 230. Specifically, for example, one drive controller 220 may be provided for X number (where X is an integer of 2 or greater) of flash packages 230. In accordance with this, one drive controller 220 will manage the corresponding relationships between the logical addresses and the physical addresses for each of X number of flash packages 230.

Further, for example, a data migration (a data migration in chunk units) between RAID groups may be carried out without passing through the storage controller 4. Specifically, for example, the storage controller 4 may notify the migration-source address and the migration-destination address to the drive controller 220 corresponding to the migration-source and/or the migration-destination, and may migrate the data inside the physical block allocated to the logical block corresponding to the migration-source chunk to the physical block allocated to the logical block corresponding to the migration-destination chunk between the drive controller 220 corresponding to the migration-source and the drive controller 220 corresponding to the migration-destination without going through the storage controller 4.

REFERENCE SIGNS LIST

1 . . . Storage system

The invention claimed is:

1. A storage system comprising:
   a plurality of first flash memory drives configuring a first RAID group and a plurality of second flash memory drives configuring a second RAID group; and
   a storage controller coupled to a host computer and the first and the second drives;
   wherein each of the first and the second flash memory drives includes a drive controller and a storage area, the storage area comprising a plurality of physical blocks, each of the physical blocks comprising a plurality of pages, the drive controller allocating a part of the physical blocks to a plurality of logical blocks provided by the drive controller, managing an unallocated part of the physical blocks as free blocks, executing a read or write process to respective pages of the allocated physical blocks, erasing all of the pages of one of the physical blocks when the one of the physical blocks is unmapped from the logical block, and;
   wherein the storage controller provides to the host computer, a logical unit configured by a plurality of logical chunks, manages a plurality of physical chunks, each of the physical chunks configured by ones of the logical blocks of either one of the first or the second RAID groups, and allocates one of the physical chunks to one of the logical chunks in response to a write operation addressed within the one of the logical chunks;
   wherein if a write error has occurred in a write operation addressed in a first one of the physical chunks configured by the ones of the logical blocks of the first RAID group due to a shortage of free blocks in one or more of the first flash memory drives, the storage controller is configured to migrate data from the first one of the physical chunks to a second one of the physical chunks configured by ones of the logical blocks of the second RAID group, allocate the second one of the physical chunks to one of the logical chunks where the first one of the physical chunks has been allocated and send an instruction to unmap the first one of the physical chunks to the first flash memory drives, and
   wherein each of the drive controllers of the first flash memory drives receiving the instruction to unmap the first one of the physical chunks are configured to unmap the respective storage area corresponding to the logical blocks configuring the first one of the physical chunks.

2. The storage system according to claim 1, comprising:
   wherein the storage controller is configured to deallocate a third physical chunk from one of the logical chunks, and send an instruction to unmap the third physical chunk to the drives, and
   wherein the drive controllers which received the instruction is configured to unmap storage area corresponding to logical blocks configuring the third physical chunk.

3. The storage system according to claim 1, comprising:
   wherein the storage controller is configured to delete the logical unit, send an instruction to unmap all the physical chunks allocated to the logical unit to the drives, and
   wherein the drive controllers which received the instruction is configured to unmap storage area corresponding to logical blocks configuring the physical chunks allocated to the logical unit.

* * * * *